US011348579B1

(12) United States Patent
Strand et al.

(10) Patent No.: US 11,348,579 B1
(45) Date of Patent: May 31, 2022

(54) VOLUME INITIATED COMMUNICATIONS

(71) Applicant: Amazon Technologies, Inc., Seattle, WA (US)

(72) Inventors: William Alexander Strand, Sammamish, WA (US); Brandon William Porter, Yarrow Point, WA (US)

(73) Assignee: Amazon Technologies, Inc., Seattle, WA (US)

( * ) Notice: Subject to any disclaimer, the term of this patent is extended or adjusted under 35 U.S.C. 154(b) by 136 days.

(21) Appl. No.: 16/538,045

(22) Filed: Aug. 12, 2019

Related U.S. Application Data

(63) Continuation of application No. 14/869,422, filed on Sep. 29, 2015, now abandoned.

(51) Int. Cl.
*G10L 21/00* (2013.01)
*G10L 15/22* (2006.01)
(Continued)

(52) U.S. Cl.
CPC .......... *G10L 15/22* (2013.01); *G10L 15/1822* (2013.01); *G10L 15/26* (2013.01); *G10L 25/03* (2013.01); *H03G 3/20* (2013.01)

(58) Field of Classification Search
CPC ... G10L 15/22; G10L 2015/223; G10L 15/08; G10L 15/30; G10L 25/78; G10L 2025/783; G10L 25/48; G10L 15/20; G10L 17/06; G10L 17/22; G10L 2015/227; G10L 21/02; G10L 15/07; G10L 15/10; G10L 19/008; G10L 21/028; G06F 3/167; G06F 3/165; G06F 16/433; G06F 1/163; G06F 1/3231; G06F 21/606; G06F 21/34; G06F 3/017; G06F 21/32; G06F 2221/2111; G06F 21/30; G06F 3/0481; G06F 2203/0381; G06F 21/31; H04M 1/72412; H04M 2201/40; H04M 2203/5072; H04M 1/0202; H04M 1/6058; H04M 2250/12; H04M 3/567; H04M 3/569; H04M 1/72454; H04M 2203/2088; H04M 2203/2094; H04M 2207/18; H04M 3/42263; H04M 3/58; H04M 2203/5027; H04M 1/2535; H04M 1/72513; H04L 2012/2849; H04L 12/2821; H04L 65/601; H04L 67/125; H04L 29/06027; H04L 67/04; H04L 67/14;
(Continued)

(56) References Cited

U.S. PATENT DOCUMENTS 8,441,356 B1 * 5/2013 Tedesco ............. G08B 21/0453
340/573.1
9,940,094 B1 * 4/2018 Robbins ................. G06F 3/165
(Continued)

*Primary Examiner* — Michael Ortiz-Sanchez
(74) *Attorney, Agent, or Firm* — Pierce Atwood LLP

(57) ABSTRACT

A system incorporating volume activated communications. A system with local devices linked to a remote server that is capable of processing voice commands is capable of linking local devices in a communications link where the link is initiated upon high volume speech being detected by a receiving device. A target device is determined based on an estimated connection between users at the respective devices. Audio is then sent from the receiving device to the target device resulting in a communication link between the two devices, allowing communication between the users.

17 Claims, 16 Drawing Sheets

(51) Int. Cl.
*G10L 15/26* (2006.01)
*G10L 15/18* (2013.01)
*H03G 3/20* (2006.01)
*G10L 25/03* (2013.01)

(58) Field of Classification Search
CPC ... H04L 65/1046; H04L 67/22; H04L 9/0872; H04L 43/08; H04W 4/023; H04W 4/80; H04W 4/00; H04W 4/38; H04W 88/02; H04W 4/08; H04W 4/16; H04W 12/63; H04W 4/029; H04W 12/64; G06K 9/00335; G06Q 30/0261
See application file for complete search history.

(56) References Cited

U.S. PATENT DOCUMENTS

| | | | |
|---|---|---|---|
| 2008/0069069 A1* | 3/2008 | Schessel | H04L 65/1053 370/342 |
| 2014/0115059 A1* | 4/2014 | Van Wie | H04W 4/50 709/204 |
| 2015/0181398 A1* | 6/2015 | Garbin | H04W 4/029 455/417 |
| 2015/0228281 A1* | 8/2015 | Raniere | G10L 15/22 704/275 |
| 2016/0196596 A1* | 7/2016 | Van Wie | H04N 7/157 705/26.41 |
| 2016/0259419 A1* | 9/2016 | Chatterjee | G01S 13/878 |

* cited by examiner

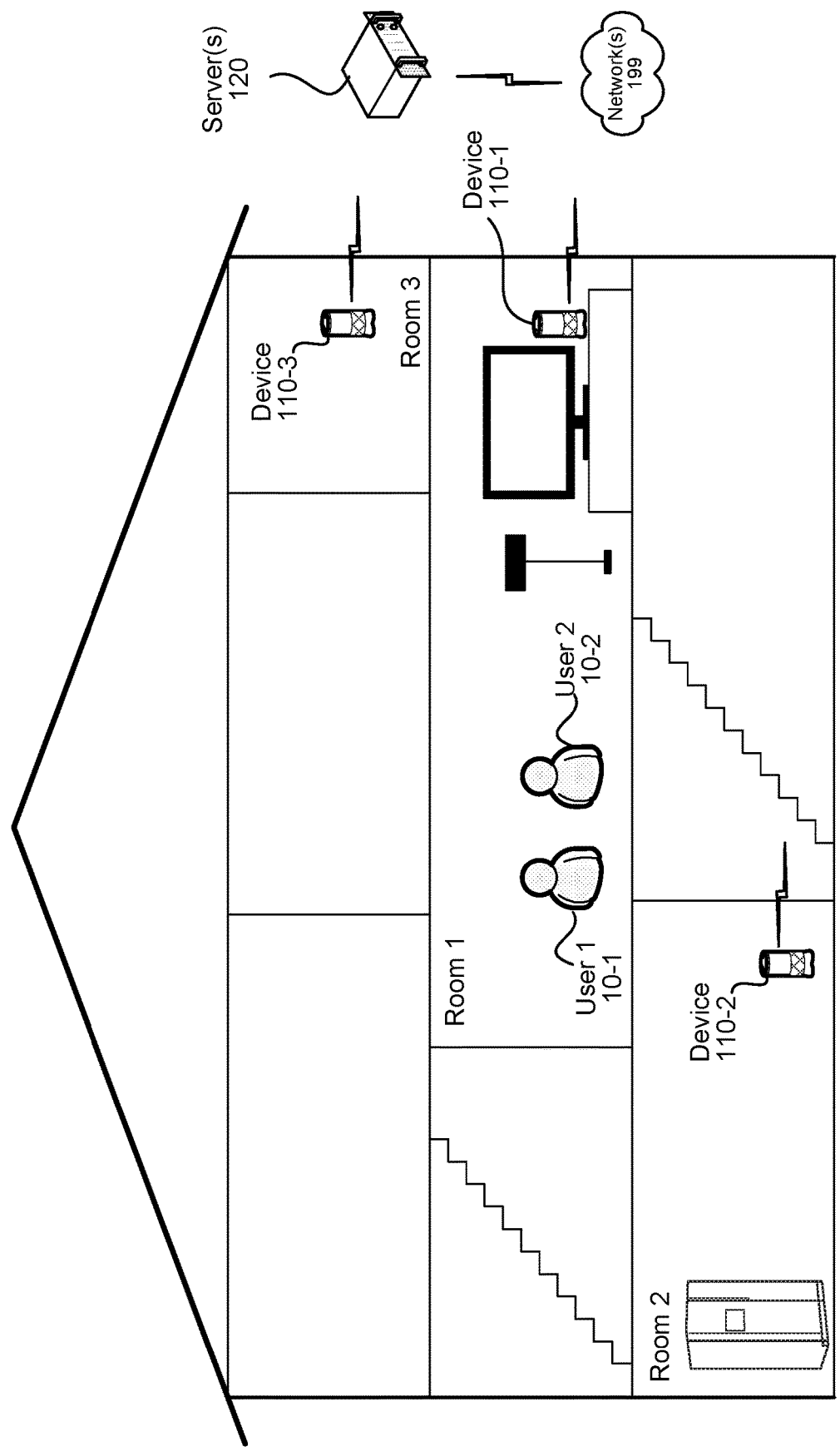

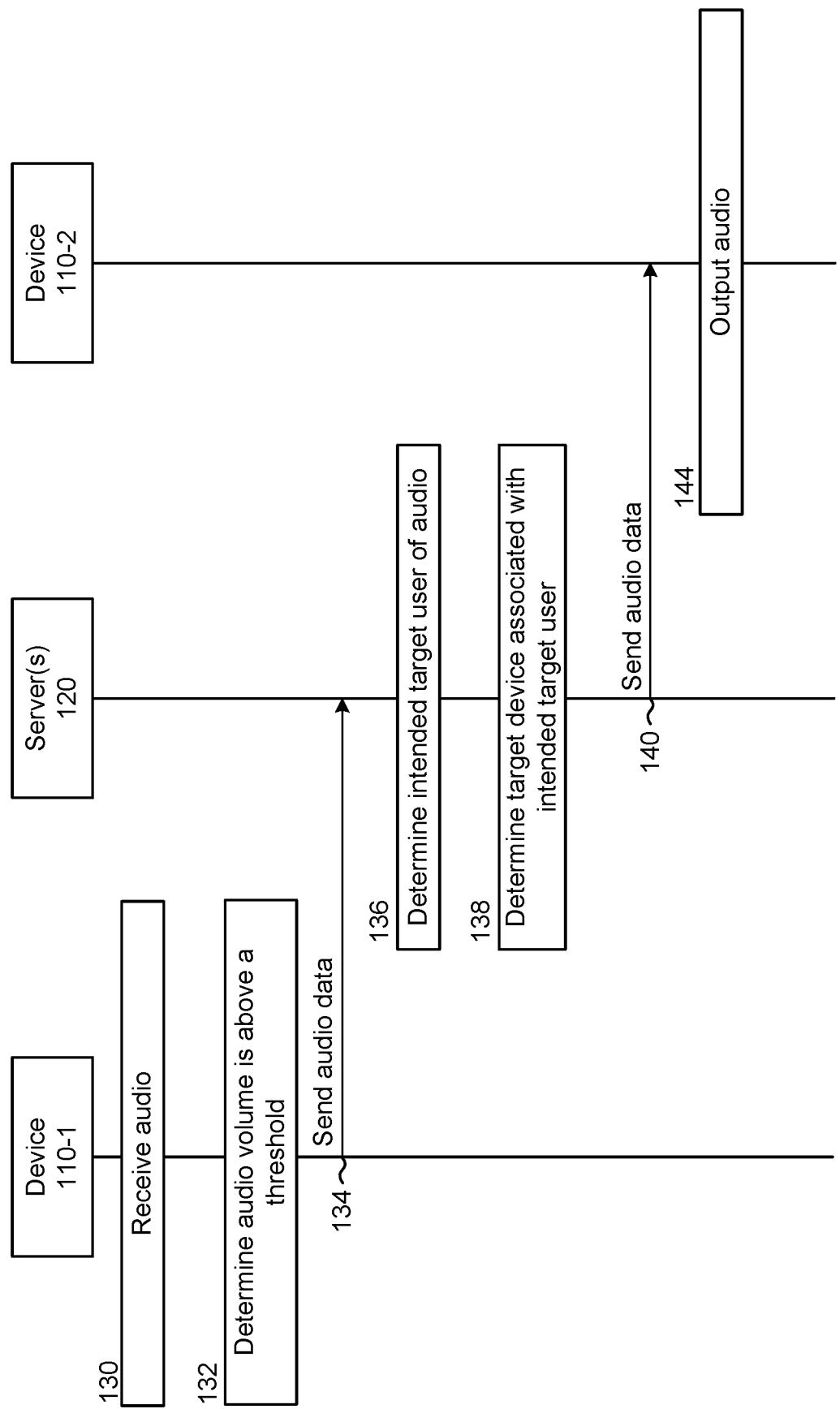

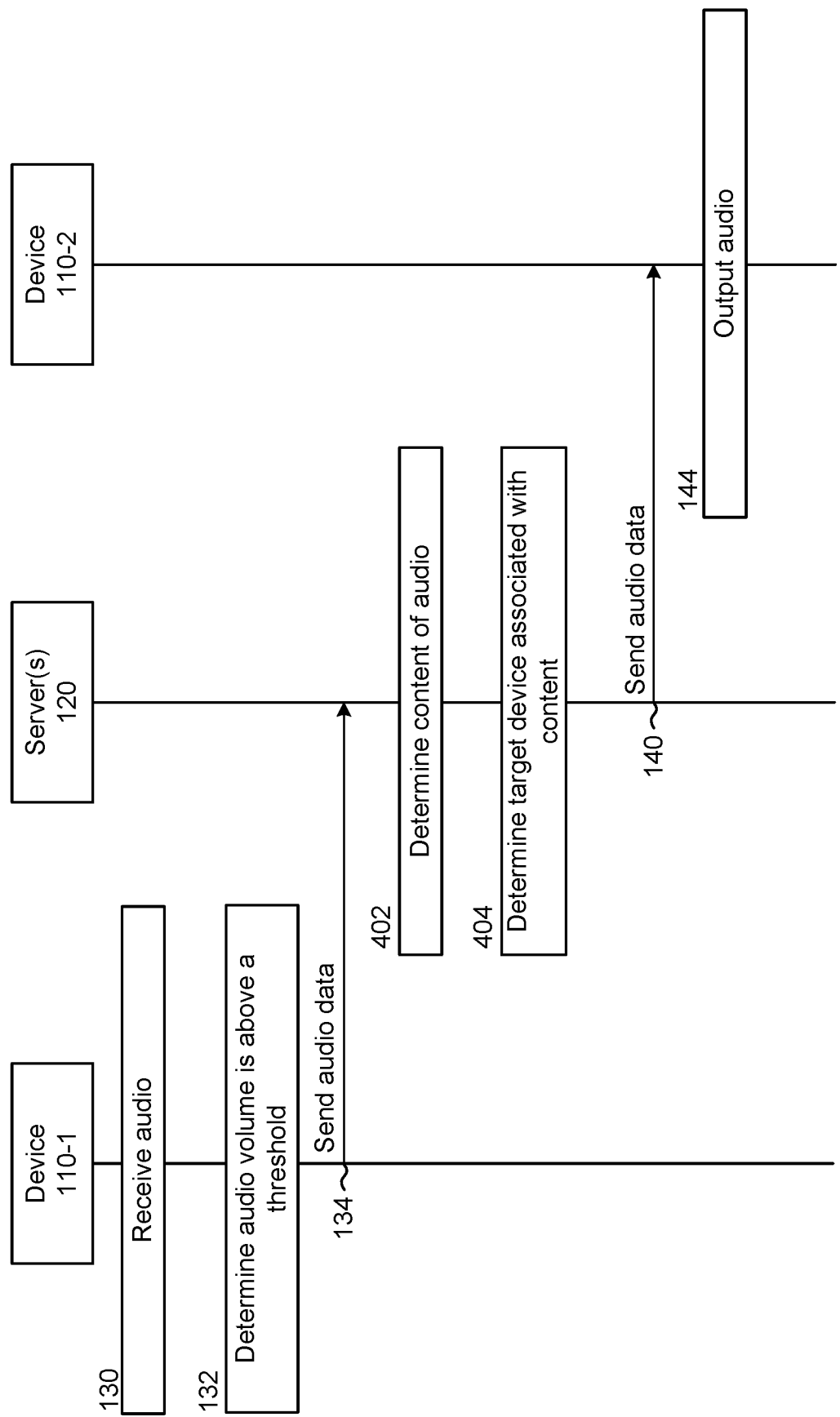

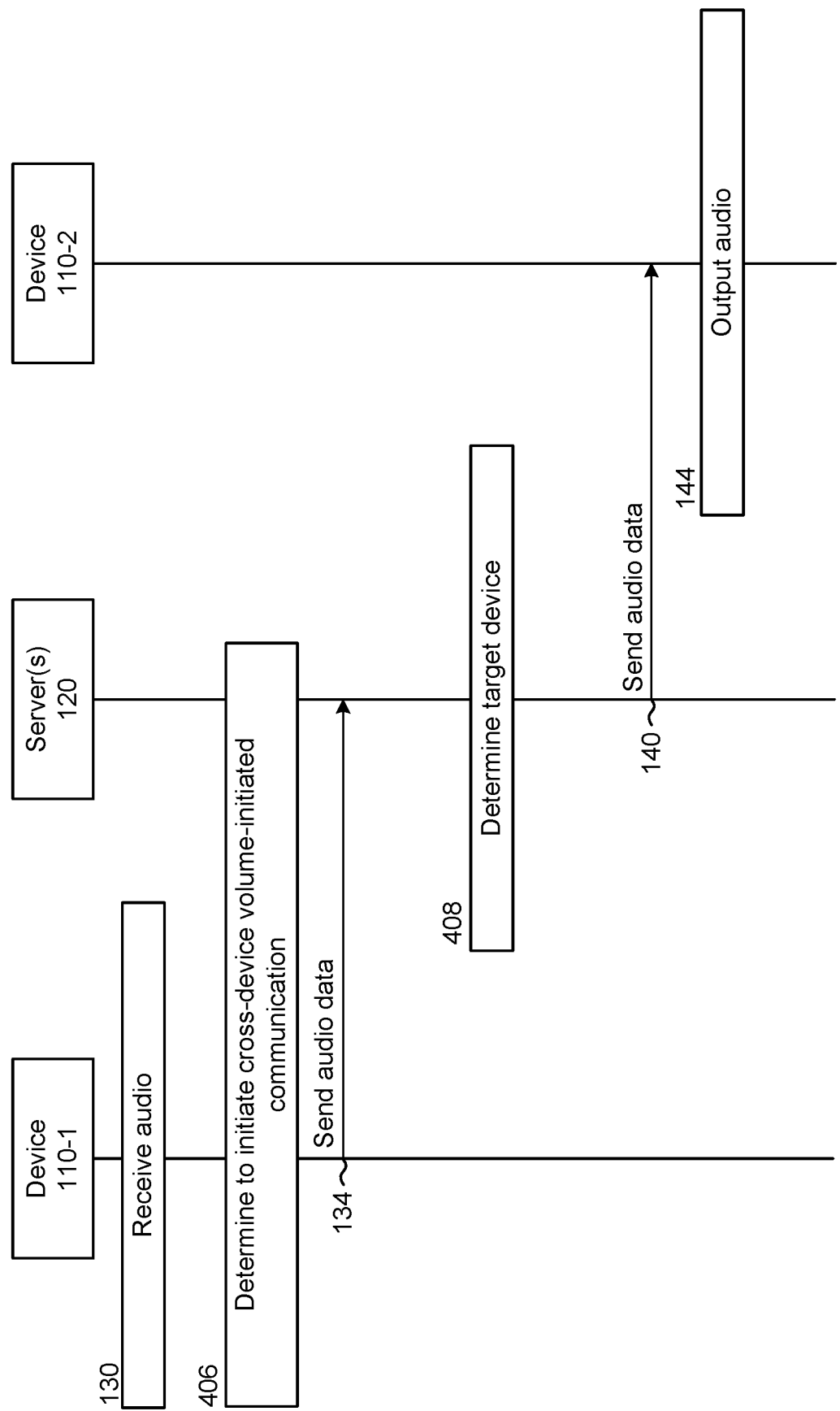

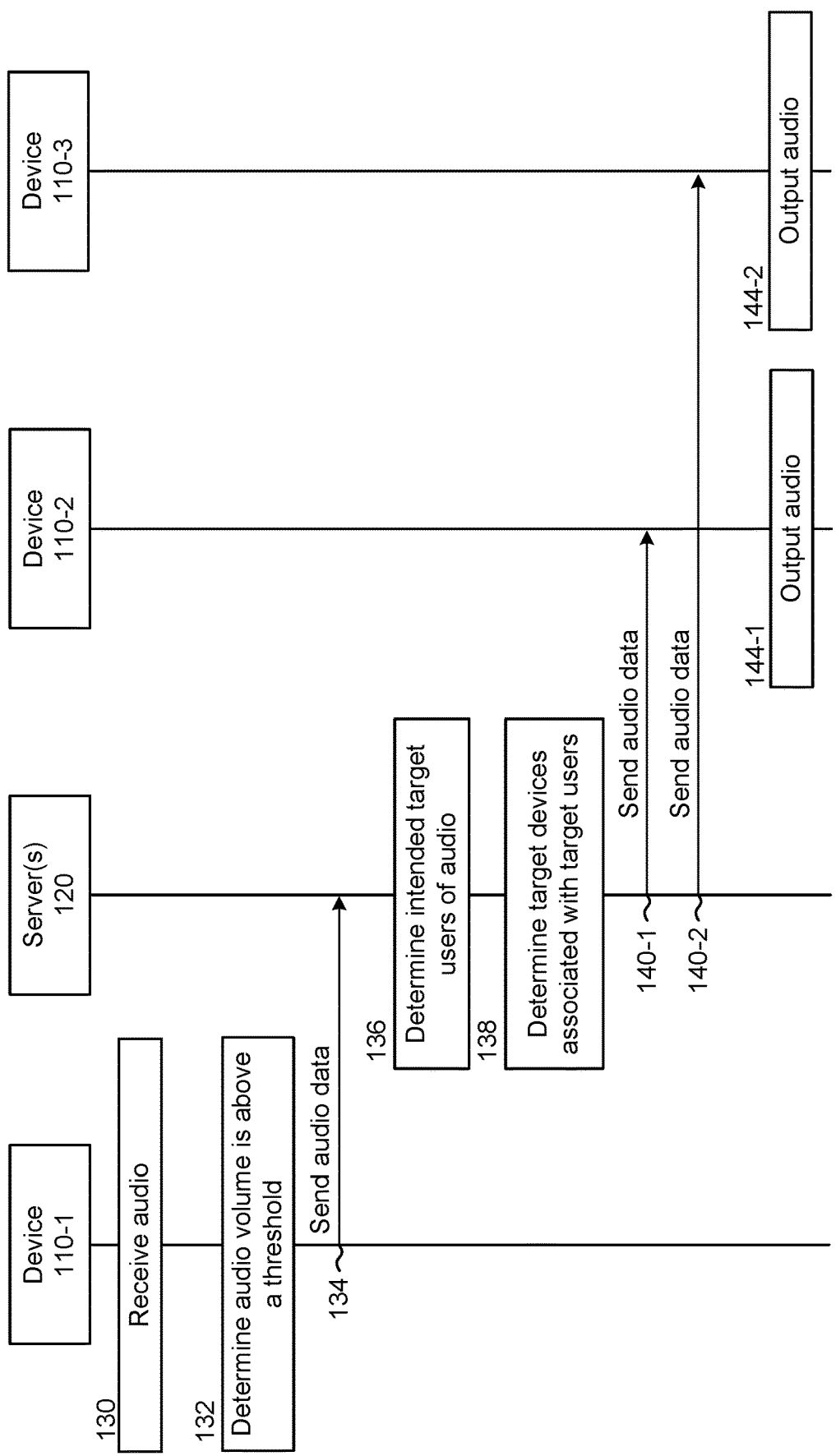

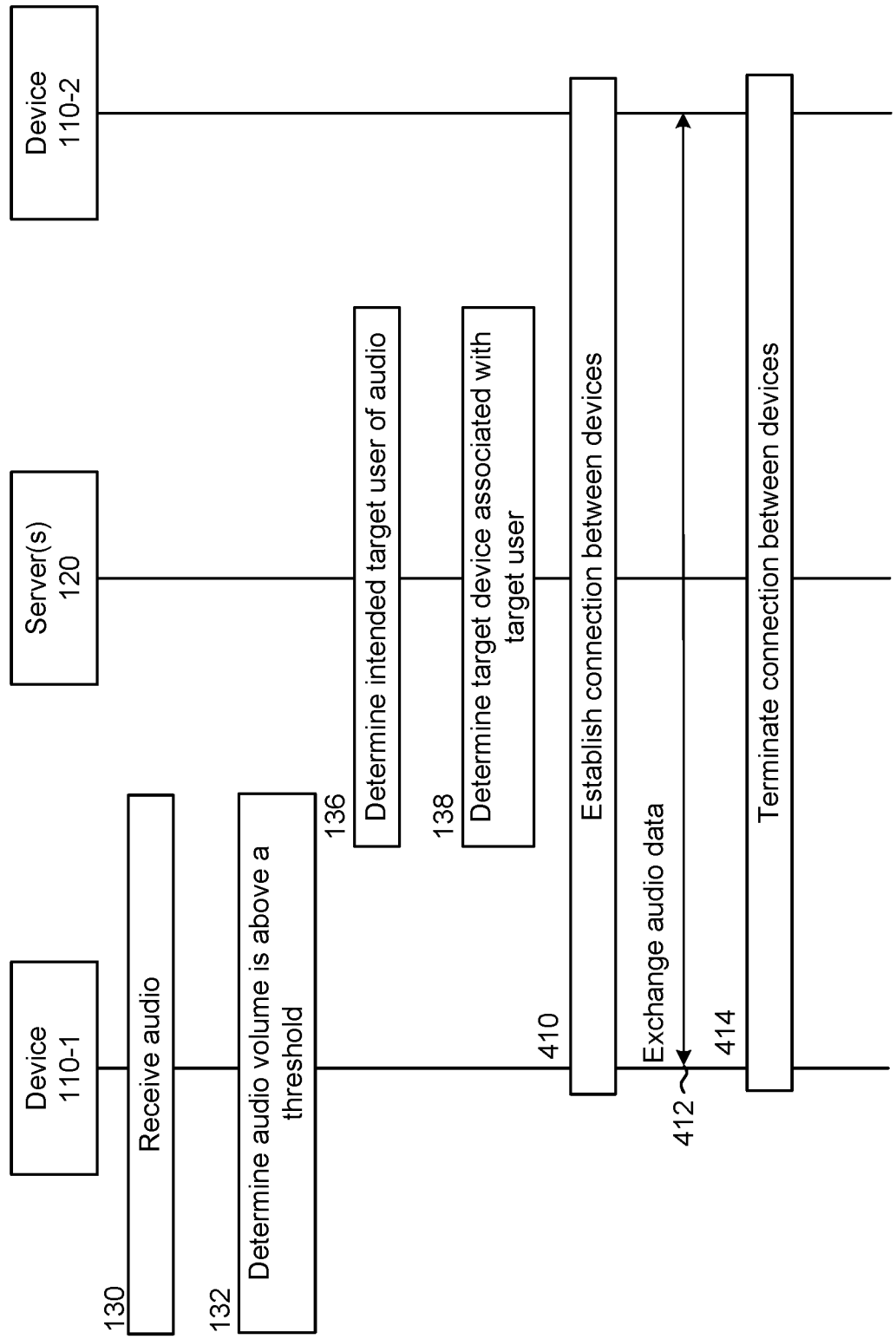

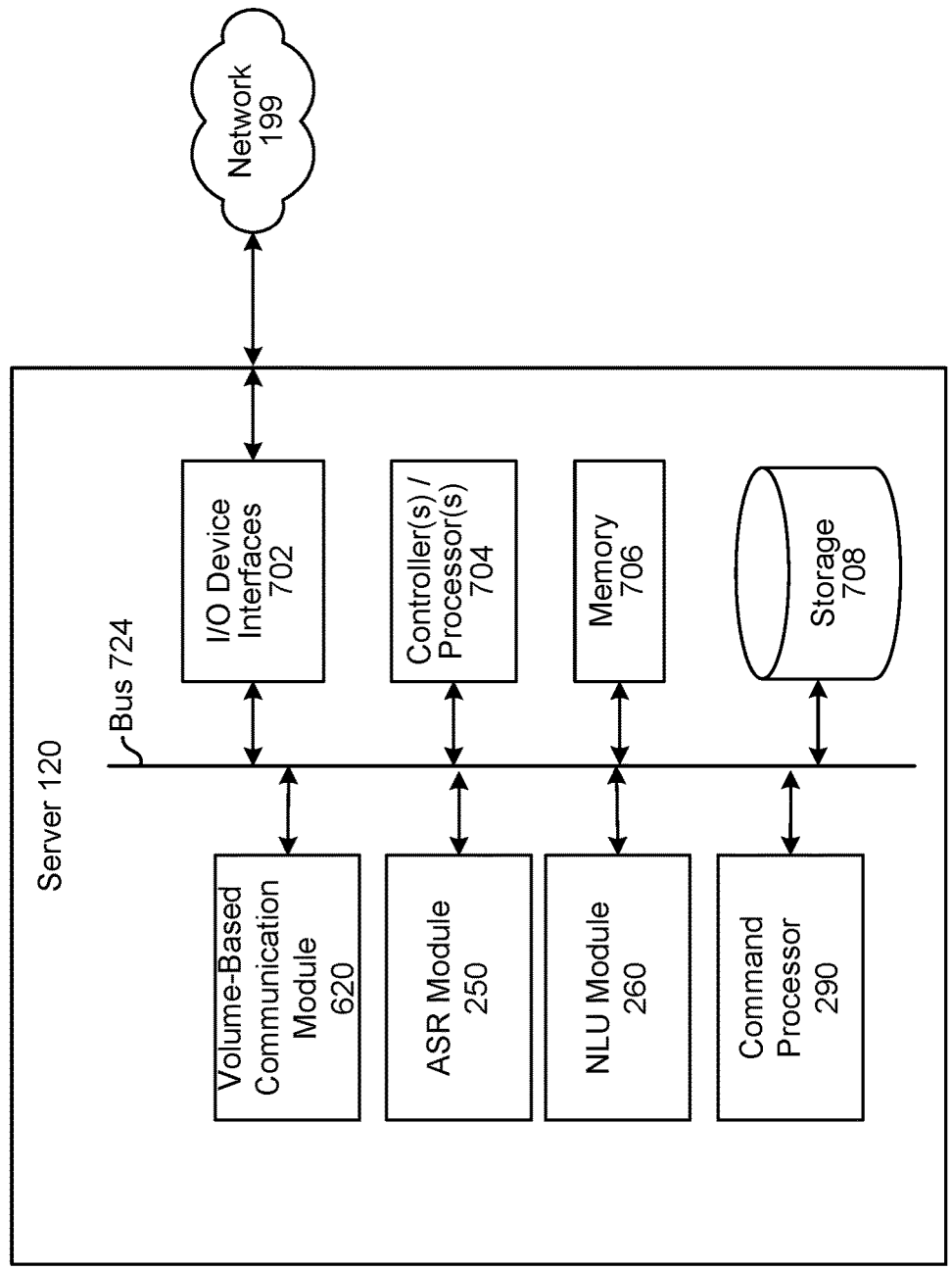

VOLUME INITIATED COMMUNICATIONS

CROSS REFERENCE TO RELATED APPLICATION

This application is a continuation of, and claims the benefit of priority of, U.S. Non-provisional patent application Ser. No. 14/869,422, filed Sep. 29, 2015 and entitled "VOLUME INITIATED COMMUNICATIONS". The contents of which is expressly incorporated herein by reference in its entirety.

BACKGROUND

Speech recognition systems have progressed to the point where humans can interact with computing devices entirely relying on speech. Such systems employ techniques to identify the words spoken by a human user based on the various qualities of a received audio input. Speech recognition combined with natural language understanding processing techniques enable speech-based user control of a computing device to perform tasks based on the user's spoken commands. The combination of speech recognition and natural language understanding processing techniques is commonly referred to as speech processing. Speech processing may also convert a user's speech into text data which may then be provided to various text-based software applications.

Speech processing may be used by computers, hand-held devices, telephone computer systems, kiosks, and a wide variety of other devices to improve human-computer interactions.

BRIEF DESCRIPTION OF DRAWINGS

For a more complete understanding of the present disclosure, reference is now made to the following description taken in conjunction with the accompanying drawings.

FIGS. 3A-3F illustrate configurations and operations of a system to operate volume-initiated communications according to embodiments of the present disclosure.

FIGS. 4A-4E illustrate communications and operations among devices to operate volume-initiated communications according to embodiments of the present disclosure.

FIG. 7 is a block diagram conceptually illustrating example components of a server according to embodiments of the present disclosure.

DETAILED DESCRIPTION

Figure 1:
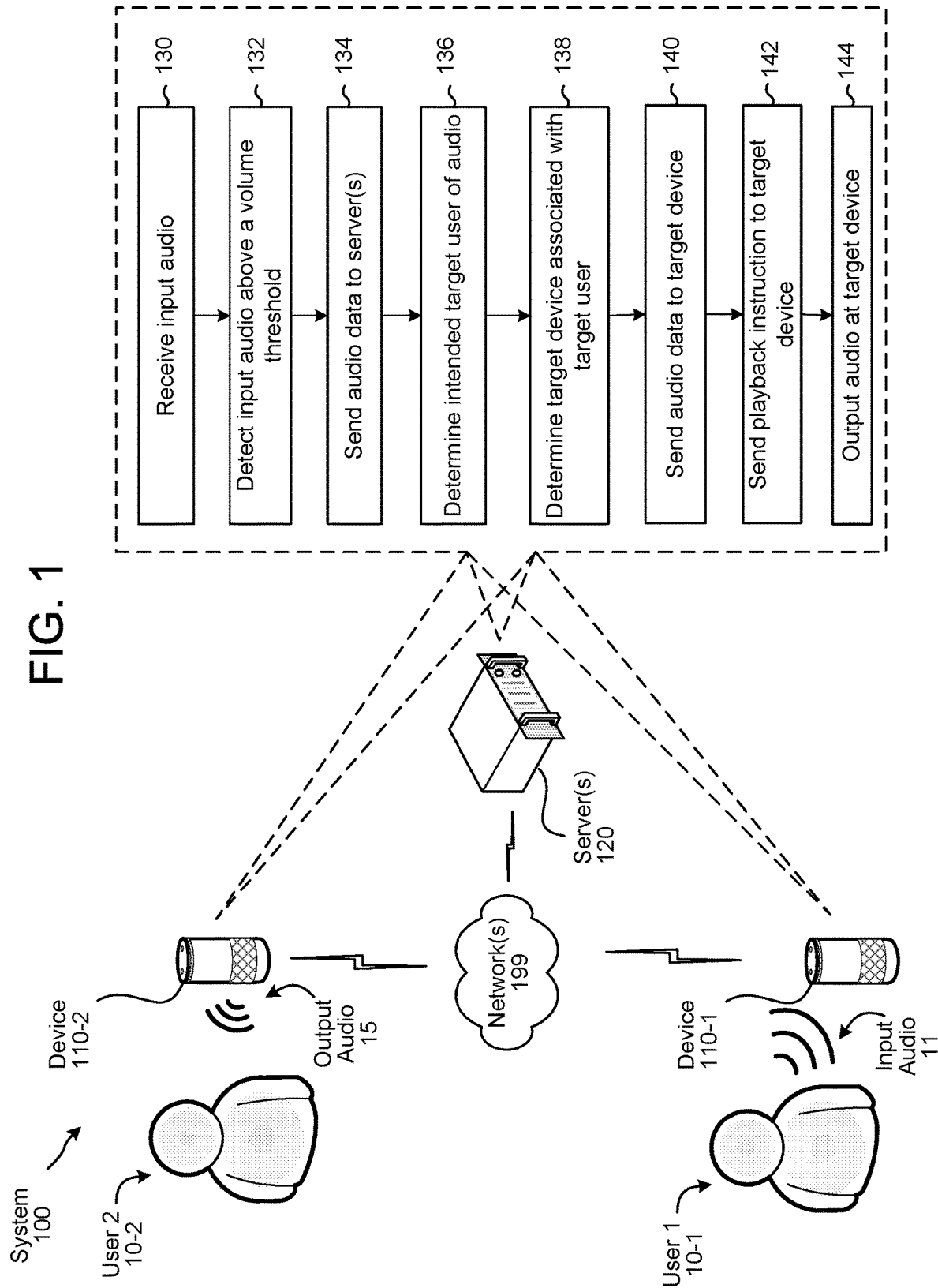
FIG. 1 illustrates a system for configurable keyword recognition according to embodiments of the present disclosure.

Automatic speech recognition (ASR) is a field of computer science, artificial intelligence, and linguistics concerned with transforming audio data associated with speech into text representative of that speech. Similarly, natural language understanding (NLU) is a field of computer science, artificial intelligence, and linguistics concerned with enabling computers to derive meaning from text input containing natural language. ASR and NLU are often used together as part of a speech processing system.

ASR and NLU can be computationally expensive. That is, significant computing resources may be needed to process ASR and NLU processing within a reasonable time frame. Because of this, a distributed computing environment may be used to when performing speech processing. A typical such distributed environment may involve a local device having one or more microphones being configured to capture sounds from a user speaking and convert those sounds into an audio signal. The audio signal/data may then be sent to a downstream remote device for further processing, such as converting the audio signal into an ultimate command. The command may then be executed by a combination of remote and local devices depending on the command itself.

As part of a distributed speech processing system, a local device may be configured to continuously send all detected audio to the remote device. There are several drawbacks to such an approach. One drawback is that such communications would require significant bandwidth and networking resources. Another drawback to such an approach is that privacy concerns may make it undesirable for a local device to send all captured audio to a remote device. A still further drawback is that a remote device may waste significant computing resources processing all incoming audio when no commands are being issued in the majority of the audio.

To account for these problems, a local device may be configured to only activate upon a user speaking a particular waking command to wake the local device so the user may speak a further command. The waking command (which may be referred to as a wakeword), may include an indication for the system to perform further processing. The local device may continually listen for the wakeword and may disregard any audio detected that does not include the wakeword. Typically, systems are configured to detect a wakeword, and then process any subsequent audio following the wakeword (plus perhaps a fixed, but short amount of audio pre-wakeword) to detect any commands in the subsequent audio. As an example, a wakeword may include a name by which a user refers to a device. Thus, if the device was named "Alexa," and the wakeword was "Alexa," a user may command a voice controlled device to play music by saying "Alexa, play some music." The device, recognizing the wakeword "Alexa" would understand the subsequent audio (in this example, "play some music") to include a command of some sort and would send audio data corresponding to that subsequent audio to a remote device (or maintain it locally) to perform speech processing on that audio to determine what the command is for execution. Provided services/commands may include performing actions or activities, rendering media, obtaining and/or providing information, providing information via generated or synthesized speech via a local device, initiating Internet-based services on behalf of the user, and so forth.

A distributed speech processing system may operate using many different local devices that are located proximate to one or more users where multiple local devices are connected, for example over a computer network, to one or more remote devices, such as back-end servers. The local devices and remote devices may be considered as part of a functioning system as commands spoken to one local device may be sent to a remote device that is in communication with multiple other local devices.

Such a connected system, where multiple devices may be equipped with varying degrees of speech processing capability, may be leveraged to assist speech-enabled, and lower latency asynchronous communication between users. For example, multiple local devices may be distributed throughout a home. The system may be configured to connect multiple local devices together for user communication purposes based on the volume of detected audio, such as speech spoken by a user. Specifically, a first person at a first location in a home may be shouting to a second person at a second location in the home. A local device at the first location may detect the shout and determine that the first person is speaking at a loud volume. The loud volume speech may function as a wake event, thus "waking" the first local device to send audio to a remote server, even in the absence of a specially configured wakeword (such as Alexa). The remote server may receive the audio (which includes the speech of the first person) and determine that the target of the speech is not necessarily the system (such as would be the case for a spoken command) but rather the second user. The remote device may determine that the second user is at the second location and may then send the audio (and an instruction to playback the audio) to a second local device at the second location. Thus, a distributed speech processing system may be configured to function as a dynamic communication exchange system, one that is activated by high volume speech.

As shown in FIG. 1, a system 100 may be configured to detect high volume audio and send the audio to an intended recipient. As shown in FIG. 1, a system 100 may include one or more devices 110-1 local to a first user 10-1, as well as one or more networks 199 and one or more servers 120 connected to device 110-1 across network(s) 199. The server(s) 120 may be capable of performing traditional speech processing (such as ASR and NLU) as described herein. A single server may be capable of performing all speech processing or multiple server(s) 120 may combine to perform the speech processing. Further, the server(s) 120 may be configured to execute certain commands, such as commands spoken by user 10-1. In addition, certain speech detection or command execution functions may be performed by device 110-1.

As shown in FIG. 1, the system 100 receives (130) input audio 11, for example through local device 110-1. The system then detects (132) input audio above a volume threshold. For example, the local device 110-1 may detect that input audio 11 is sufficiently louder than ambient noise or normal speech received by local device 110-1. (E.g., a lamp breaking, a user shouting "JOHN, COME DOWN HERE!", etc.) The local device 110-1 may then "wake," process the input audio into audio data and send (134) the corresponding audio data to the server(s) 120 across network 199. The system 100 may determine (136) the intended target user/recipient of the audio. For example, the system may process the audio data contents to identify an intended recipient (e.g., "John") or the system may determine that the first user 10-1 and a second user 10-2 were recently in a same room and may link them together. Other methods for determining the intended target user, such as those discussed below, may also be used. The system may then determine (138) a target device associated with the intended target user. For example, the system may determine that user 10-2 is proximate to device 110-2. The system may then send (140) the audio data to the target device (e.g., device 110-2) and may also send (142) instructions to the target device to playback the audio data. The system (144), for example through device 110-2, may then playback the audio data to produce and play output audio 15. Thus, the speech controlled system 100 may be used to transmit high volume speech from device 110-1 to device 110-2, thus allowing communication between user 10-1 and 10-2.

Although FIG. 1, and lower figures/discussion, illustrate the operation of the system in a particular order, the steps described may be performed in any order (as well as certain steps removed or added) without departing from the intent of the disclosure.

Figure 2:
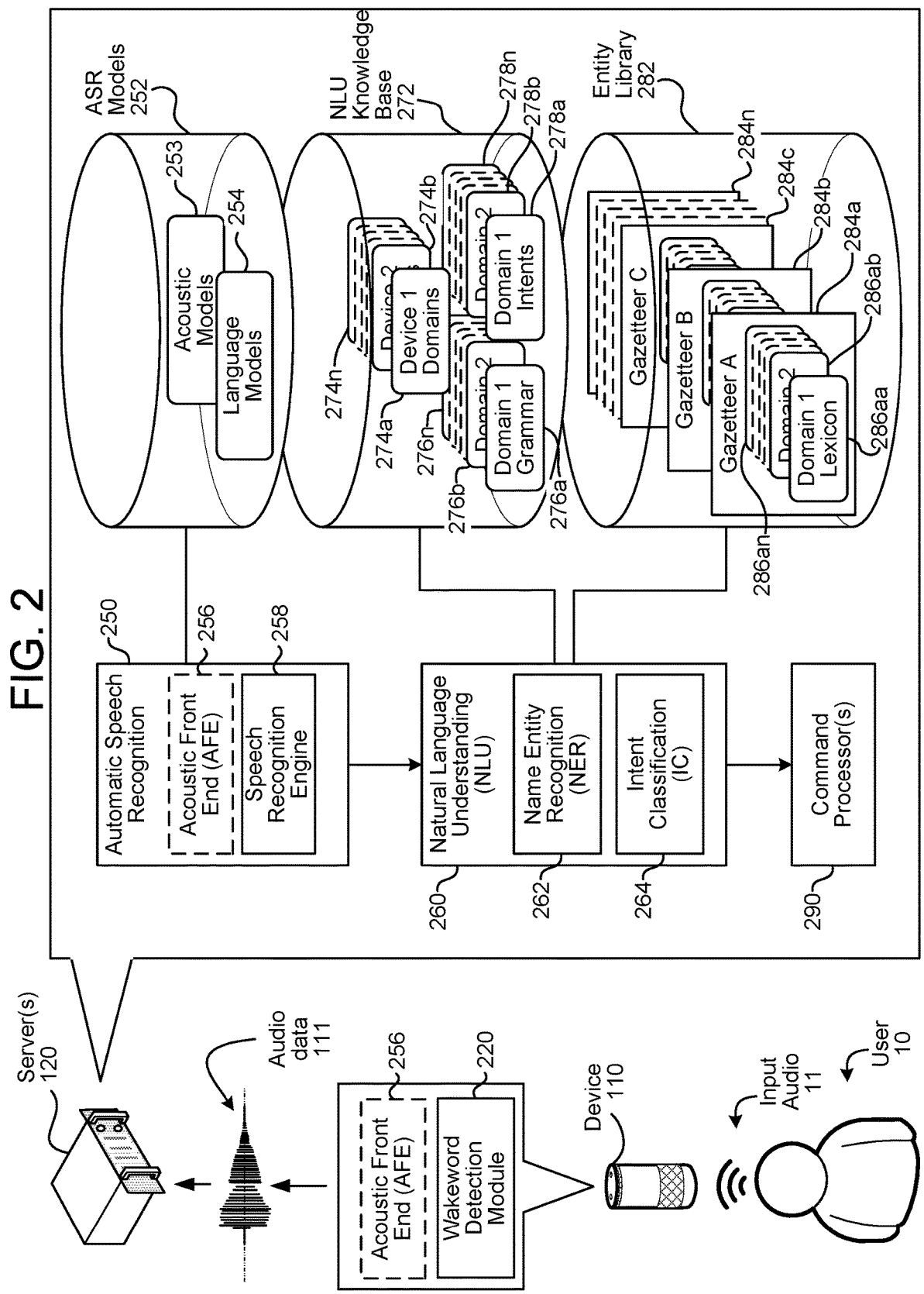
FIG. 2 is a conceptual diagram of speech processing may be performed by the system following keyword detection.

Further details of volume initiated communications are explained below, following a discussion of the overall speech processing system of FIG. 2. The volume initiated communications as described in reference to FIG. 1 may be operated by a system that incorporates various speech processing components as described in FIG. 2. FIG. 2 is a conceptual diagram of how a spoken utterance is traditionally processed, allowing a system to capture and execute commands spoken by a user, such as spoken commands that may follow a wakeword. The various components illustrated may be located on a same or different physical devices. Communication between various components illustrated in FIG. 2 may occur directly or across a network 199. An audio capture component, such as a microphone of device 110, captures audio 11 corresponding to a spoken utterance. The device 110, using a wakeword detection module 220 (further described below), then processes the audio, or audio data corresponding to the audio, to determine if a keyword (such as a wakeword) is detected in the audio. Following detection of a wakeword, the device sends audio data 111 corresponding to the utterance, to a server 120 that includes an ASR module 250. The audio data 111 may be output from an acoustic front end (AFE) 256 located on the device 110 prior to transmission. Or the audio data 111 may be in a different form for processing by a remote AFE 256, such as the AFE 256 located with the ASR module 250.

The wakeword detection module 220 works in conjunction with other components of the device, for example a microphone (not pictured) to detect keywords in audio 11. For example, the device 110 may convert audio 11 into audio data, and process the audio data with the wakeword detection module 220 to determine whether speech is detected, and if so, if the audio data comprising speech matches an audio signature and/or model corresponding to a particular keyword.

The device 110 may use various techniques to determine whether audio data includes speech. Some embodiments may apply voice activity detection (VAD) techniques. Such techniques may determine whether speech is present in an audio input based on various quantitative aspects of the audio input, such as the spectral slope between one or more frames of the audio input; the energy levels of the audio input in one or more spectral bands; the signal-to-noise ratios of the audio input in one or more spectral bands; or other quantitative aspects. In other embodiments, the device 110 may implement a limited classifier configured to distinguish speech from background noise. The classifier may be implemented by techniques such as linear classifiers, support vector machines, and decision trees. In still other embodiments, Hidden Markov Model (HMM) or Gaussian Mixture Model (GMM) techniques may be applied to compare the audio input to one or more acoustic models in speech storage, which acoustic models may include models corresponding to speech, noise (such as environmental noise or background noise), or silence. Still other techniques may be used to determine whether speech is present in the audio input.

Once speech is detected in the audio received by the device 110 (or separately from speech detection), the device 110 may use the wakeword detection module 220 to perform wakeword detection to determine when a user intends to speak a command to the device 110. This process may also be referred to as keyword detection, with the wakeword being a specific example of a keyword. Specifically, keyword detection is typically performed without performing linguistic analysis, textual analysis or semantic analysis. Instead, incoming audio (or audio data) is analyzed to determine if specific characteristics of the audio match preconfigured acoustic waveforms, audio signatures, or other data to determine if the incoming audio "matches" stored audio data corresponding to a keyword.

Thus, the wakeword detection module 220 may compare audio data to stored models or data to detect a wakeword. One approach for wakeword detection applies general large vocabulary continuous speech recognition (LVCSR) systems to decode the audio signals, with wakeword searching conducted in the resulting lattices or confusion networks. LVCSR decoding may require relatively high computational resources. Another approach for wakeword spotting builds hidden Markov models (HMM) for each key wakeword word and non-wakeword speech signals respectively. The non-wakeword speech includes other spoken words, background noise etc. There can be one or more HMMs built to model the non-wakeword speech characteristics, which are named filler models. Viterbi decoding is used to search the best path in the decoding graph, and the decoding output is further processed to make the decision on keyword presence. This approach can be extended to include discriminative information by incorporating hybrid DNN-HMM decoding framework. In another embodiment the wakeword spotting system may be built on deep neural network (DNN)/recursive neural network (RNN) structures directly, without HMM involved. Such a system may estimate the posteriors of wakewords with context information, either by stacking frames within a context window for DNN, or using RNN. Following-on posterior threshold tuning or smoothing is applied for decision making. Other techniques for wakeword detection, such as those known in the art, may also be used.

Once the wakeword is detected, the local device 110 may "wake" and begin transmitting audio data 111 corresponding to input audio 11 to the server(s) 120 for speech processing. Further, a local device 110 may "wake" upon detection of speech/spoken audio above a threshold, as described herein. Audio data corresponding to that audio may be sent to a server 120 for routing to a recipient device or may be sent to the server for speech processing for interpretation of the included speech (either for purposes of enabling voice-communications and/or for purposes of executing a command in the speech). Thus, upon receipt by the server(s) 120, an ASR module 250 may convert the audio data 111 into text. The ASR transcribes audio data into text data representing the words of the speech contained in the audio data. The text data may then be used by other components for various purposes, such as executing system commands, inputting data, etc. A spoken utterance in the audio data is input to a processor configured to perform ASR which then interprets the utterance based on the similarity between the utterance and pre-established language models 254 stored in an ASR model knowledge base (ASR Models Storage 252). For example, the ASR process may compare the input audio data with models for sounds (e.g., subword units or phonemes) and sequences of sounds to identify words that match the sequence of sounds spoken in the utterance of the audio data.

The different ways a spoken utterance may be interpreted (i.e., the different hypotheses) may each be assigned a probability or a confidence score representing the likelihood that a particular set of words matches those spoken in the utterance. The confidence score may be based on a number of factors including, for example, the similarity of the sound in the utterance to models for language sounds (e.g., an acoustic model 253 stored in an ASR Models Storage 252), and the likelihood that a particular word which matches the sounds would be included in the sentence at the specific location (e.g., using a language or grammar model). Thus each potential textual interpretation of the spoken utterance (hypothesis) is associated with a confidence score. Based on the considered factors and the assigned confidence score, the ASR process 250 outputs the most likely text recognized in the audio data. The ASR process may also output multiple hypotheses in the form of a lattice or an N-best list with each hypothesis corresponding to a confidence score or other score (such as probability scores, etc.).

The device or devices performing the ASR processing may include an acoustic front end (AFE) 256 and a speech recognition engine 258. The acoustic front end (AFE) 256 transforms the audio data from the microphone into data for processing by the speech recognition engine. The speech recognition engine 258 compares the speech recognition data with acoustic models 253, language models 254, and other data models and information for recognizing the speech conveyed in the audio data. The AFE may reduce noise in the audio data and divide the digitized audio data into frames representing a time intervals for which the AFE determines a number of values, called features, representing the qualities of the audio data, along with a set of those values, called a feature vector, representing the features/qualities of the audio data within the frame. Many different features may be determined, as known in the art, and each feature represents some quality of the audio that may be useful for ASR processing. A number of approaches may be used by the AFE to process the audio data, such as mel-frequency cepstral coefficients (MFCCs), perceptual linear predictive (PLP) techniques, neural network feature vector techniques, linear discriminant analysis, semi-tied covariance matrices, or other approaches known to those of skill in the art.

The speech recognition engine 258 may process the output from the AFE 256 with reference to information stored in speech/model storage (252). Alternatively, post front-end processed data (such as feature vectors) may be received by the device executing ASR processing from another source besides the internal AFE. For example, the device 110 may process audio data into feature vectors (for example using an on-device AFE 256) and transmit that information to a server across a network 199 for ASR processing. Feature vectors may arrive at the server encoded, in which case they may be decoded prior to processing by the processor executing the speech recognition engine 258.

The speech recognition engine 258 attempts to match received feature vectors to language phonemes and words as known in the stored acoustic models 253 and language models 254. The speech recognition engine 258 computes recognition scores for the feature vectors based on acoustic information and language information. The acoustic information is used to calculate an acoustic score representing a likelihood that the intended sound represented by a group of feature vectors matches a language phoneme. The language information is used to adjust the acoustic score by considering what sounds and/or words are used in context with each other, thereby improving the likelihood that the ASR process will output speech results that make sense grammatically.

The speech recognition engine 258 may use a number of techniques to match feature vectors to phonemes, for example using Hidden Markov Models (HMMs) to determine probabilities that feature vectors may match phonemes. Sounds received may be represented as paths between states of the MINI and multiple paths may represent multiple possible text matches for the same sound.

Following ASR processing, the ASR results may be sent by the speech recognition engine 258 to other processing components, which may be local to the device performing ASR and/or distributed across the network(s) 199. For example, ASR results in the form of a single textual representation of the speech, an N-best list including multiple hypotheses and respective scores, lattice, etc. may be sent to a server, such as server 120, for natural language understanding (NLU) processing, such as conversion of the text into commands for execution, either by the device 110, by the server 120, or by another device (such as a server running a search engine, etc.)

The device performing NLU processing 260 (e.g., server(s) 120) may include various components, including potentially dedicated processor(s), memory, storage, etc. A device configured for NLU processing may include a named entity recognition (NER) module 252 and intent classification (IC) module 264, a result ranking and distribution module 266, and knowledge base 272. The NLU process may also utilize gazetteer information (284a-284n) stored in entity library storage 282. The gazetteer information may be used for entity resolution, for example matching ASR results with different entities (such as song titles, contact names, etc.) Gazetteers may be linked to users (for example a particular gazetteer may be associated with a specific user's music collection), may be linked to certain domains (such as shopping), or may be organized in a variety of other ways.

The NLU process takes textual input (such as processed from ASR 250 based on the utterance 11) and attempts to make a semantic interpretation of the text. That is, the NLU process determines the meaning behind the text based on the individual words and then implements that meaning. NLU processing 260 interprets a text string to derive an intent or a desired action from the user as well as the pertinent pieces of information in the text that allow a device (e.g., device 110) to complete that action. For example, if a spoken utterance is processed using ASR 250 and outputs the text "call mom" the NLU process may determine that the user intended to activate a telephone in his/her device and to initiate a call with a contact matching the entity "mom."

The NLU may process several textual inputs related to the same utterance. For example, if the ASR 250 outputs N text segments (as part of an N-best list), the NLU may process all N outputs to obtain NLU results. The NLU process may be configured to parsed and tagged to annotate text as part of NLU processing. For example, for the text "call mom," "call" may be tagged as a command (to execute a phone call) and "mom" may be tagged as a specific entity and target of the command (and the telephone number for the entity corresponding to "mom" stored in a contact list may be included in the annotated result).

To correctly perform NLU processing of speech input, the NLU process 260 may be configured to determine a "domain" of the utterance so as to determine and narrow down which services offered by the endpoint device (e.g., server 120 or device 110) may be relevant. For example, an endpoint device may offer services relating to interactions with a telephone service, a contact list service, a calendar/scheduling service, a music player service, etc. Words in a single text query may implicate more than one service, and some services may be functionally linked (e.g., both a telephone service and a calendar service may utilize data from the contact list).

The name entity recognition module 262 receives a query in the form of ASR results and attempts to identify relevant grammars and lexical information that may be used to construe meaning. To do so, a name entity recognition module 262 may begin by identifying potential domains that may relate to the received query. The NLU knowledge base 272 includes a databases of devices (274a-274n) identifying domains associated with specific devices. For example, the device 110 may be associated with domains for music, telephony, calendaring, contact lists, and device-specific communications, but not video. In addition, the entity library may include database entries about specific services on a specific device, either indexed by Device ID, User ID, or Household ID, or some other indicator.

A domain may represent a discrete set of activities having a common theme, such as "shopping", "music", "calendaring", etc. As such, each domain may be associated with a particular language model and/or grammar database (276a-276n), a particular set of intents/actions (278a-278n), and a particular personalized lexicon (286). Each gazetteer (284a-284n) may include domain-indexed lexical information associated with a particular user and/or device. For example, the Gazetteer A (284a) includes domain-index lexical information 286aa to 286an. A user's music-domain lexical information might include album titles, artist names, and song names, for example, whereas a user's contact-list lexical information might include the names of contacts. Since every user's music collection and contact list is presumably different, this personalized information improves entity resolution.

A query is processed applying the rules, models, and information applicable to each identified domain. For example, if a query potentially implicates both communications and music, the query will be NLU processed using the grammar models and lexical information for communications, and will be processed using the grammar models and lexical information for music. The responses based on the query produced by each set of models is scored (discussed further below), with the overall highest ranked result from all applied domains is ordinarily selected to be the correct result.

An intent classification (IC) module 264 parses the query to determine an intent or intents for each identified domain, where the intent corresponds to the action to be performed that is responsive to the query. Each domain is associated with a database (278a-278n) of words linked to intents. For example, a music intent database may link words and phrases such as "quiet," "volume off," and "mute" to a "mute" intent. The IC module 264 identifies potential intents for each identified domain by comparing words in the query to the words and phrases in the intents database 278.

In order to generate a particular interpreted response, the NER 262 applies the grammar models and lexical information associated with the respective domain. Each grammar model 276 includes the names of entities (i.e., nouns) commonly found in speech about the particular domain (i.e., generic terms), whereas the lexical information 286 from the gazetteer 284 is personalized to the user(s) and/or the device. For instance, a grammar model associated with the shopping domain may include a database of words commonly used when people discuss shopping.

The intents identified by the IC module 264 are linked to domain-specific grammar frameworks (included in 276) with "slots" or "fields" to be filled. For example, if "play music" is an identified intent, a grammar (276) framework or frameworks may correspond to sentence structures such as "Play {Artist Name}," "Play {Album Name}," "Play {Song name}," "Play {Song name} by {Artist Name}," etc. However, to make recognition more flexible, these frameworks would ordinarily not be structured as sentences, but rather based on associating slots with grammatical tags.

For example, the NER module 260 may parse the query to identify words as subject, object, verb, preposition, etc., based on grammar rules and models, prior to recognizing named entities. The identified verb may be used by the IC module 264 to identify intent, which is then used by the NER module 262 to identify frameworks. A framework for an intent of "play" may specify a list of slots/fields applicable to play the identified "object" and any object modifier (e.g., a prepositional phrase), such as {Artist Name}, {Album Name}, {Song name}, etc. The NER module 260 then searches the corresponding fields in the domain-specific and personalized lexicon(s), attempting to match words and phrases in the query tagged as a grammatical object or object modifier with those identified in the database(s).

This process may include semantic tagging, which is the labeling of a word or combination of words according to their type/semantic meaning. Parsing may be performed using heuristic grammar rules, or an NER model may be constructed using techniques such as hidden Markov models, maximum entropy models, log linear models, conditional random fields (CRF), and the like.

For instance, a query of "play mother's little helper by the rolling stones" might be parsed and tagged as {Verb}: "Play," {Object}: "mother's little helper," {Object Preposition}: "by," and {Object Modifier}: "the rolling stones." At this point in the process, "Play" is identified as a verb based on a word database associated with the music domain, which the IC module 264 will determine corresponds to the "play music" intent. No determination has been made as to the meaning of "mother's little helper" and "the rolling stones," but based on grammar rules and models, it is determined that these phrase relate to the grammatical object of the query.

The frameworks linked to the intent are then used to determine what database fields should be searched to determine the meaning of these phrases, such as searching a user's gazette for similarity with the framework slots. So a framework for "play music intent" might indicate to attempt to resolve the identified object based {Artist Name}, {Album Name}, and {Song name}, and another framework for the same intent might indicate to attempt to resolve the object modifier based on {Artist Name}, and resolve the object based on {Album Name} and {Song Name} linked to the identified {Artist Name}. If the search of the gazetteer does not resolve the a slot/field using gazetteer information, the NER module 262 may search the database of generic words associated with the domain (in the NLU's knowledge base 272). So for instance, if the query was "play songs by the rolling stones," after failing to determine an album name or song name called "songs" by "the rolling stones," the NER 262 may search the domain vocabulary for the word "songs." In the alternative, generic words may be checked before the gazetteer information, or both may be tried, potentially producing two different results.

The comparison process used by the NER module 262 may classify (i.e., score) how closely a database entry compares to a tagged query word or phrase, how closely the grammatical structure of the query corresponds to the applied grammatical framework, and based on whether the database indicates a relationship between an entry and information identified to fill other slots of the framework.

The NER modules 262 may also use contextual operational rules to fill slots. For example, if a user had previously requested to pause a particular song and thereafter requested that the voice-controlled device to "please un-pause my music," the NER module 262 may apply an inference-based rule to fill a slot associated with the name of the song that the user currently wishes to play—namely the song that was playing at the time that the user requested to pause the music.

The results of NLU processing may be tagged to attribute meaning to the query. So, for instance, "play mother's little helper by the rolling stones" might produce a result of: {domain} Music, {intent} Play Music, {artist name} "rolling stones," {media type} SONG, and {song title} "mother's little helper." As another example, "play songs by the rolling stones" might produce: {domain} Music, {intent} Play Music, {artist name} "rolling stones," and {media type} SONG.

The output from the NLU processing (which may include tagged text, commands, etc.) may then be sent to a command processor 290, which may be located on a same or separate server 120 as part of system 100. The destination command processor 290 may be determined based on the NLU output. For example, if the NLU output includes a command to play music, the destination command processor 290 may be a music playing application, such as one located on device 110 or in a music playing appliance, configured to execute a music playing command. If the NLU output includes a search request, the destination command processor 290 may include a search engine processor, such as one located on a search server, configured to execute a search command.

A speech processing system, such as that illustrated in FIG. 2, may include many local devices 110 in communication with the back-end server(s) 120. The server(s) 120, or other back-end components in communication with the local devices 110, may be configured to open a communication connection between different local devices. Such a communication connection may be similar to a data or voice call in a cellular or WiFi network, may include creating an association between local devices (for example for a period of time) or may involve many other known communication connection techniques. Thus, communication data may be sent between different local devices.

Establishing such communications between local devices may take many forms. One form, as discussed above, is establishing communications between local devices as a result of high volume audio being detected at a first device. For example, if multiple local devices are located throughout a home, a first user, located near a first device, may be shouting to another user located in another part of the home. The system may detect the shouting, and relay the shout to another device closer to an intended recipient. Thus, asynchronous communications may be established using the different local devices.

Communications may be initiated based on high volume audio being detected at a receiving device. The audio may include a non-environmental sound, that is a sound that is not typically encountered in the environment where the audio was detected. For example, a device may be located in a kitchen where environmental sounds may include sounds from a dishwasher, stovetop, refrigerator, sink running, etc. Non-environmental sounds may include a window breaking, alarm sounding, etc. The device 110, server 120 and/or other system component may be configured to distinguish environmental sounds from non-environmental sounds in received audio. Such distinguishing may include machine learning techniques (such as those described below), to analyze input audio, trained model(s), etc. to determine when a non-environmental sound is detected.

One example of non-environmental sounds may include human generated sounds. Such human generated sounds may include speech (e.g., sound including distinguishable words) or non-speech (e.g., screams, vomiting, sound of a person falling). The device and/or a system of the device may be configured to detect human generated sounds in received audio. The system may determine non-environmental sounds and/or human generated sounds using machine learning techniques (such as those described below), to analyze input audio, trained model(s), etc. Such models may analyze a number of data features (for example audio frequency, time, direction of received audio, etc.) to classify incoming audio as including non-environmental sounds and/or human generated sounds.

Determination of input audio as including a non-environmental sound and/or human generated sound may be performed by a local device 110 and/or by a server 120. For faster processing, a local device 110 may first determine whether input audio exceeds a threshold and, if it does, then send the audio to a server 120 where the server 120 will determine whether the input audio includes a non-environmental sound and/or human generated sound. Alternatively, the local device 110 may both determine whether input audio exceeds a threshold and whether the input audio includes a non-environmental sound and/or human generated sound. Other performing components/orders are also possible.

Thus, communications may be initiated based on a high volume non-environmental sound, such as speech, being detected at a receiving device. For example, the first device may detect speech and determine that the speech is above a volume threshold. Or another device, such as the server 120, may determine that the speech is above the volume threshold. Detecting speech above a volume threshold may then trigger further actions such as determining the recipient device of the speech and sending the speech to the recipient device. The volume threshold may be set at a particular level (e.g., a certain dB level) and/or may be determined dynamically, that is it may be determined and/or adjusted based on ambient conditions at the first device. For example, the first device may detect ambient volume of the location of the first device. The ambient volume may include volume of various sounds proximate to the first device (noise, television audio, ongoing conversations, etc.). The system may then set the volume threshold based on the ambient volume. In certain situations a low ambient volume may result in a low volume threshold and a high ambient volume may result in a high volume threshold. In certain other situations a high ambient volume may temporarily disable volume-initiated communications as shouts detected by the first device under high ambient volume conditions may simply indicate that a user is attempting to talk over ambient noise rather than shout to a distant user (where such shouting may be assisted by the present system).

As part of determining whether to initiate device-to-device communications, or after such communications have been initiated, the system may determine the target of such communications. The target may include an intended target user, an intended target device, an intended target location (within which a mobile device may be located) or some other target. Determining a target for a communication (which may include determining whether speech is intended for a target user and/or identifying the target user/device) may occur in a number of ways. In one example, the system may determine that two users have been in the same place for a certain period of time (which may be defined by a time threshold). As a result of the users being proximate to each other, the system may store an association between the users, which may include some form of data structure, along with a potential time-based expiration of the association. User proximity may be determined in a number of ways, such as proximity of the users' wearable/portable devices to each other, audio or video processing techniques analyzing audio/video data to determine the users' proximity to each other, or other techniques. After the users have been in the same place, the system may detect that one of the users has left the area, followed by (potentially within another time threshold) the other user shouting something. The system may recognize the shouted speech, determine that the shouted speech originated with the user who didn't leave the area, and determine (using the association) that the intended recipient was the other user who had just been in the original location. Thus the system would determine that the user in the new location was the intended target of the shouted speech. The system may then identify a local device near the target user and playback the shouted speech from that nearby target device.

Figure 3B:
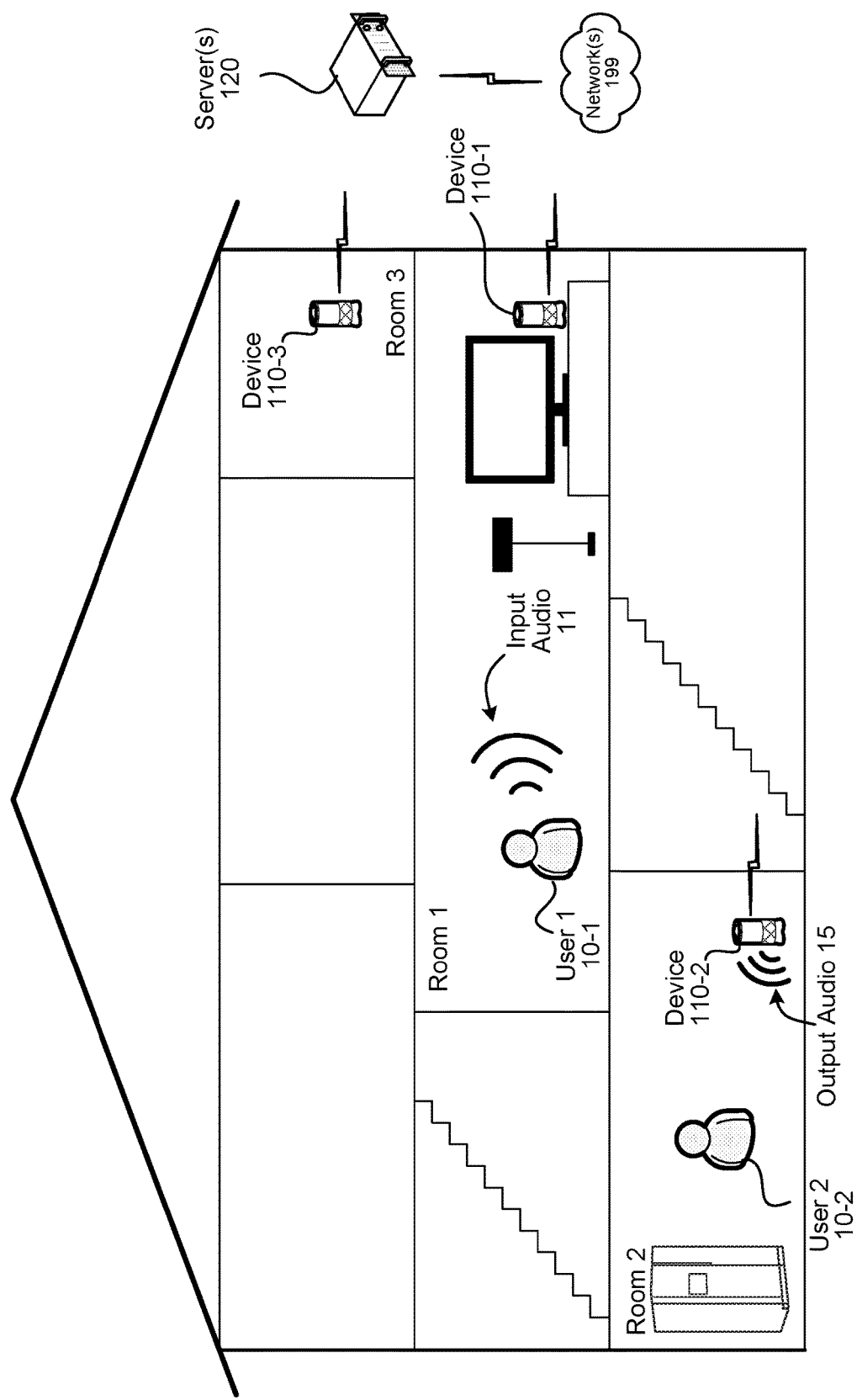

Examples of the system in operation are illustrated below in reference to FIGS. 3A-3E. As shown in FIG. 3A, two users, user 1 10-1 and user 2 10-2 are watching television in Room 1 of a house. Also in room 1 (a living room) is a first local device 110-1. Located throughout the house are other local devices including second local device 110-2, located in Room 2 (a kitchen) and third local device 110-3, located in Room 3 (a bedroom). Each local device is communicably connected to server(s) 120 over network(s) 199. The two users may be both located in Room 1 for a certain period of time, after which the system recognizes that the two users were co-located and creates and stores an association between the users, where the association is used for volume-based communications. The recognition of user proximity and creation of the association may be performed by any combination of the first local device 110-1, the server 120, or other system component. At a later time, illustrated in FIG. 3B, user 2 10-2 may leave Room 1 and go to Room 2 to get food from the kitchen. User 1 may then shout "CAN YOU PLEASE BRING ME A DRINK?" Alternatively, User 1 may fall down, causing a loud sound that is human generated, but not speech. The system may detect the shout/loud sound (illustrated as input audio 11) at the first local device 110-1. The system may determine that the shout was over a certain volume threshold, thus triggering a volume-based communication assistance protocol (which may include the various techniques and methods discussed herein). The first local device 110-1, may then "wake," convert the input audio 11 to audio data (for example an audio file or other audio data). Device 110-1 may then send the audio data across network 199 to server 120.

The system may determine that user 1 10-1 is proximate to the first local device 110-1 and thus may associate the audio data with user 1 10-1. The system may also determine that user 1 is associated with user 2 for purposes of volume-based communication based on the stored association between the users discussed above. The system may determine that user 2 10-2 is proximate to second local device 110-2. Thus, using the association between user 1 and user 2, and user 2's location, the server 120, through network 199, may send the audio data to the second local device 110-2, along with instructions to create and playback output audio 15, where the output audio 15 corresponds to the speech of the input audio 11. Thus, the shouting of user 1 may be relayed closer to the location of the intended recipient user 2, facilitating communications between user 1 and user 2.

Following initiation of volume-based communications, the system may open up a communication connection between device 110-1 and device 110-2 for purposes of allowing ongoing communication between users 1 and 2, regardless of volume of later speech (that is, speech following an initial shout). The communication connection may involve any number of ways of facilitating ongoing communications, for example routing audio data from device 110-1 to 110-2 or vice versa. The communication connection may be held open for a specific period of time, until the users are once again proximate to each other, or until another termination point has been reached.

Figure 3C:
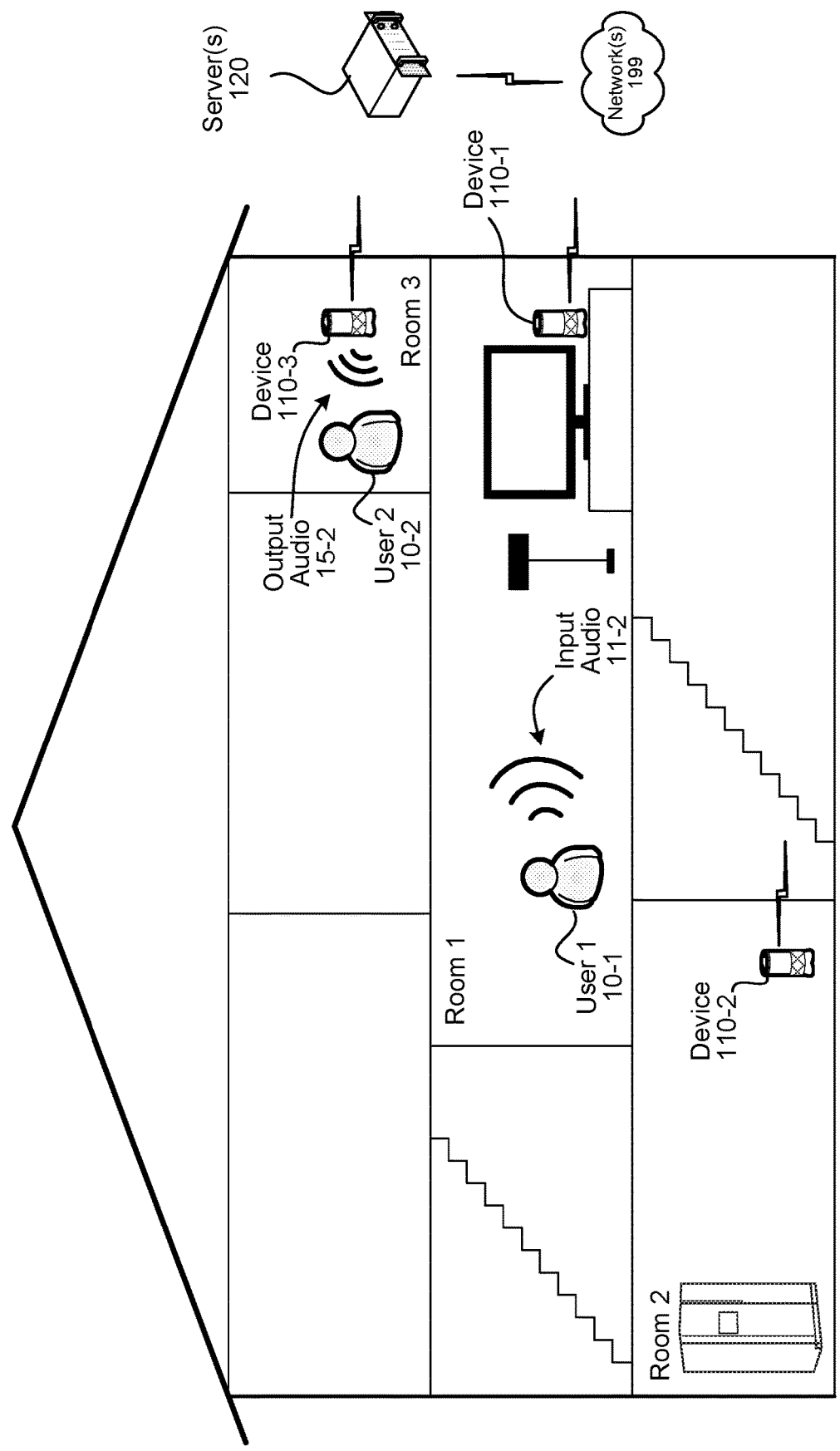

As part of an ongoing communication connection, or between shouts, the system may track the users for purposes of connection different devices to enable user-to-user communications. For example, if user 2 moves to Room 3, as illustrated in FIG. 3C, during an open communication between device 110-1 and device 110-2, the system may determine that user 2 has moved and may add device 110-3 in Room 3 to the communication connection. Device 110-3 may be added to the connection (similar to a conference call) or device 110-3 may be added and device 110-2 dropped when the system determines that user 2 is no longer proximate to device 110-2.

Figure 3D:
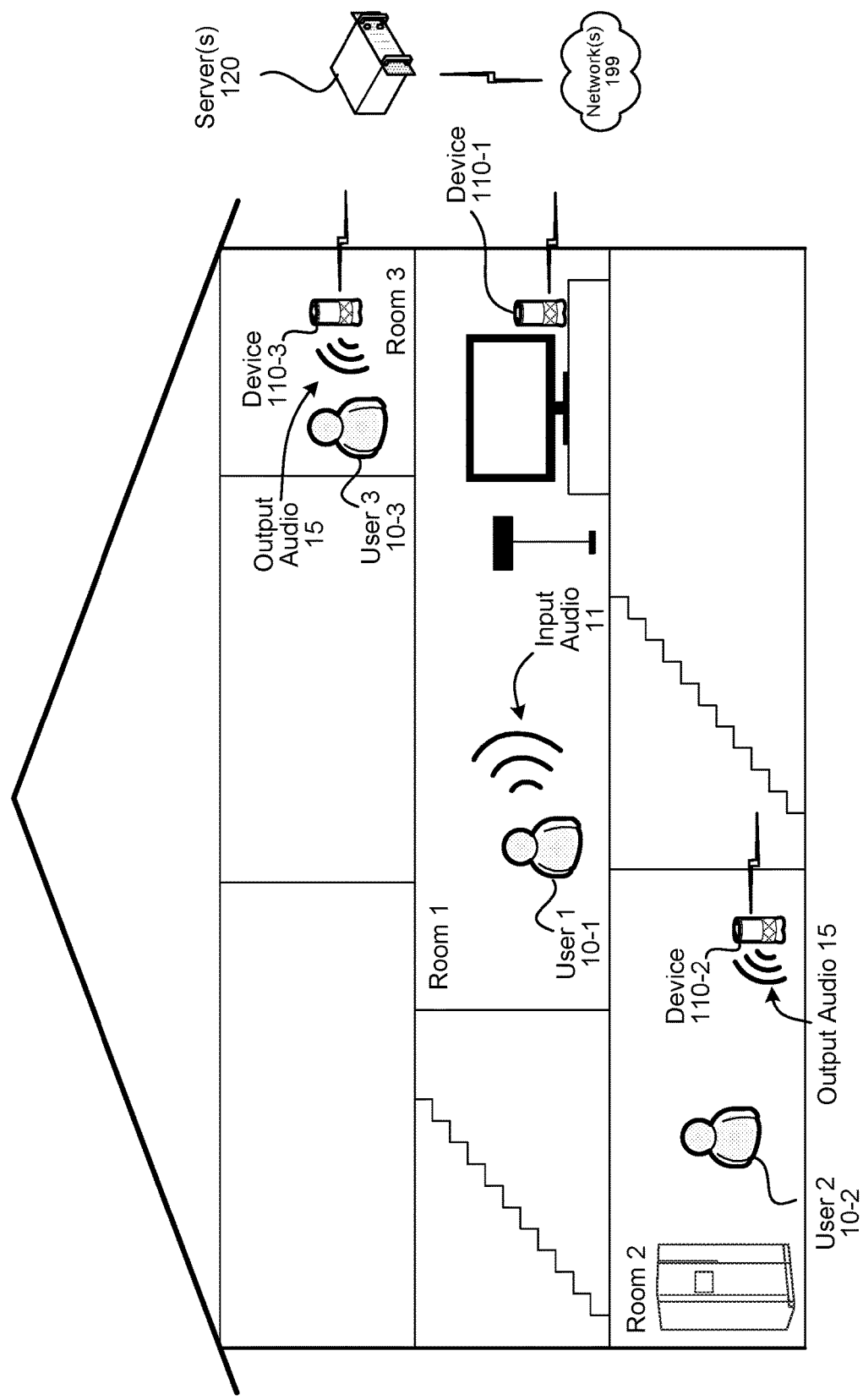

The above examples also hold for multiple target users. For example, if FIG. 3A involved three users in the living room for a period of time, and the system creating an association for users 1, 2, and 3, the shout of user 1 could be sent to both user 2 and user 3 if they left the original location. For example, as shown in FIG. 3D, user 2 may have gone to Room 2 (and thus be proximate to device 110-2) whereas user 3 went to Room 3 (and thus is proximate to device 110-3. Upon determining that the input audio 11 received by device 110-1 was above the volume threshold, determining that user 1 is proximate to device 110-1, and determining that the user is associated with both user 2 and user 3, the system may determine the locations of user 2 and user 3. After determining that they are separate from each other, but proximate to devices 110-2 and 110-3 respectively, the system may send the audio data corresponding to the input audio 11 to both devices 110-2 and 110-3, along with instructions to create and playback output audio 15, where the output audio 15 output at both devices 110-2 and 110-3 corresponds to the speech of the input audio 11.

Figure 3E:
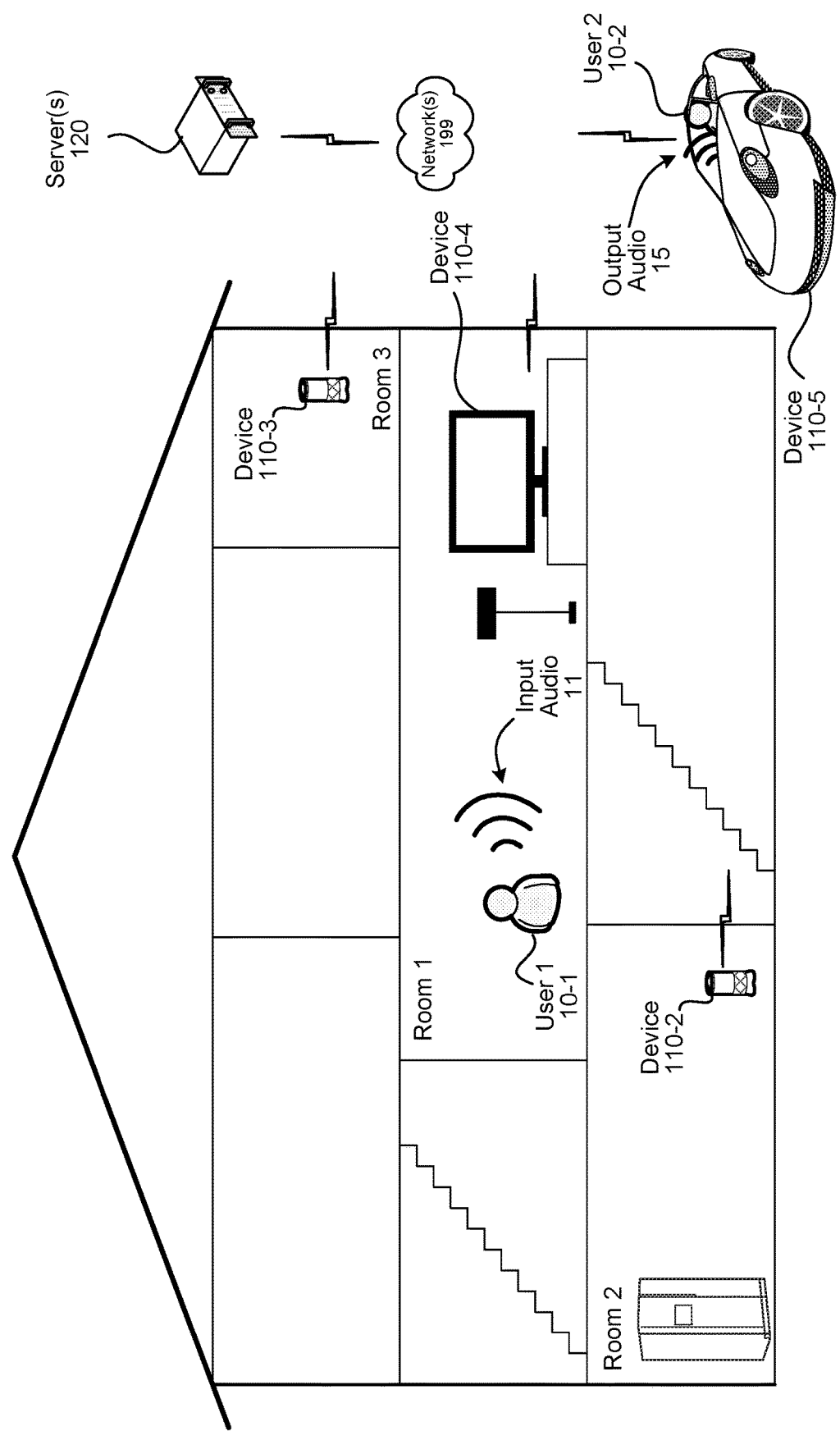

As illustrated in FIG. 3E, the local devices need not be special devices for speech processing or volume-activated communications. Other devices may incorporate components for interacting with the illustrated system. As shown in FIG. 3E, the first local device in Room 1 may be the television 110-4, rather than the originally illustrated device 110-1. The television may be communicatively connected to the network 199 (either wired or wirelessly) and thus to the server 120. A microphone of the television 110-4 may detect the input audio 11 and the process continued as described herein, with the television 110-4 acting in place of first device 110-1. Further, the local device need not be stationary. As illustrated in FIG. 3E, a vehicle 110-5 may be incorporate components for interacting with the illustrated system. The vehicle 110-5 may also be communicatively connected to the server 120 through network 199 (for example through a cellular connection). While the vehicle may be proximate to the house, the vehicle 110-5 need not be proximate to the house so long as it is communicatively connected to the network. The system may determine that user 2 is within the vehicle 110-5 and thus may route the audio data to the vehicle 110-5 along with a playback instruction. The vehicle 110-5 may then output audio 15 corresponding to the speech of input audio 11.

Figure 3F:
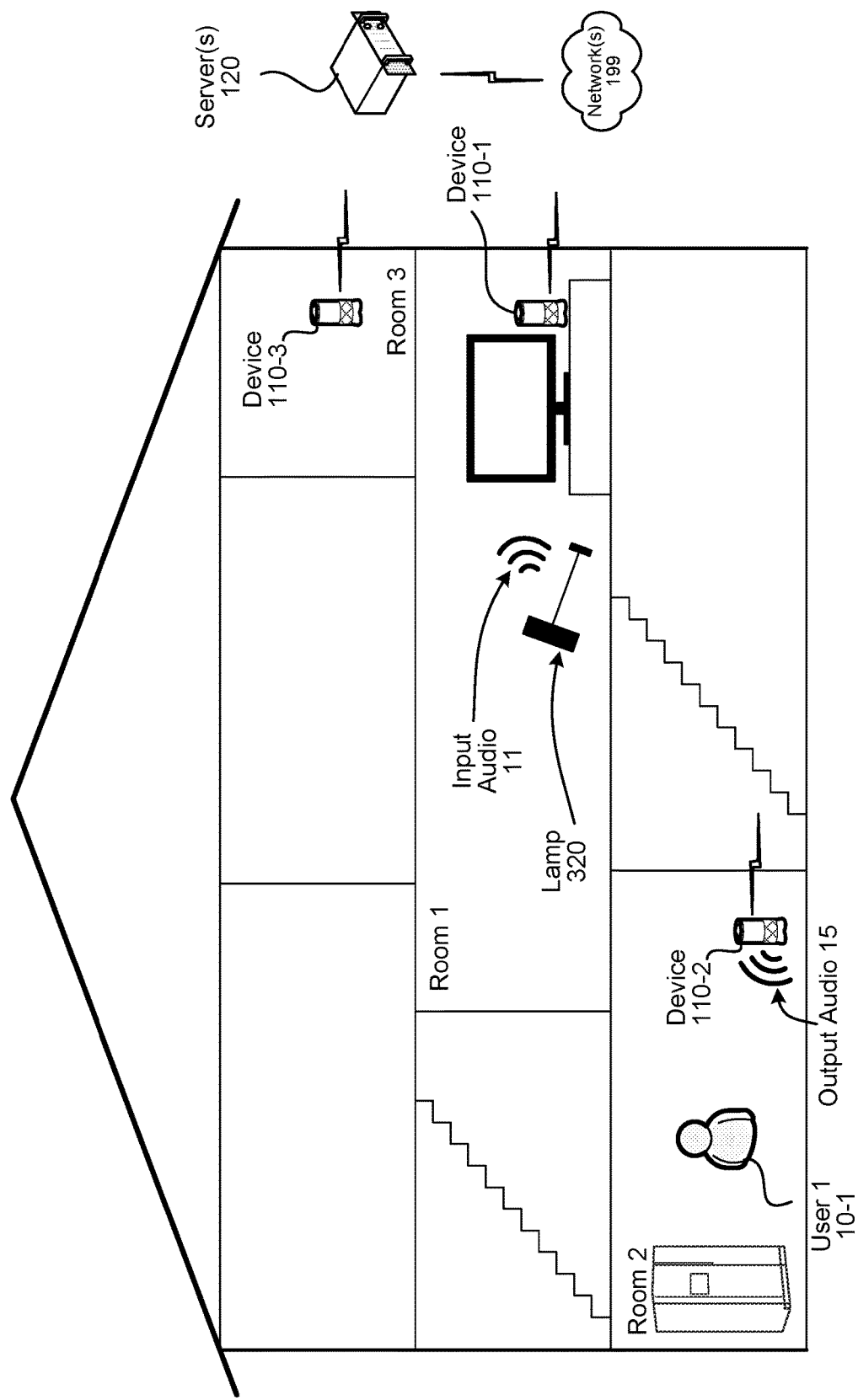

Although FIGS. 3A-3E illustrate volume-initiated communications based on human generated sound, the system may also engage in volume-initiated communications based on other types of non-environmental sound. For example, as illustrated in FIG. 3F, a lamp 320 may fall, resulting in a crashing sound carried in input audio 11. Device 110-1 may detect the input audio 11 and determine that the volume of the sound in the input audio 11 exceeds a threshold and/or includes a non-environmental noise). The device 110-1 may then send audio data corresponding to the input audio 11 to the server 120. The system may determine that the intended recipient of the sound should be user 1 (for example, because user 1 is the only person in the house). The server 120 may then determine that user 1 is in room 2 and proximate to device 110-2. The server 120 may then send audio data to the device 110-2 so the device 110-2 may output the output audio 15.

The system 100 may determine what target device to send audio data to based on network connections of the audio receiving device and the target device. For example, in the scenario of FIG. 3B, the system may detect the input audio 11 at device 110-1. The server 120 may look for devices that are on the same network as device 110-1 when determining a target device. For example, the server 120 may only select from devices on the same network as device 110-1 when determining the target (thus using same-network status as a filter when selecting a target) or may increase a score or priority of devices on the same network as device 110-1 when determining the target (thus using same-network status as a priority modifier when selecting a target). For example, device 110-1 may be connected to the same network as devices 110-2 and 110-3. Thus when the server 120 is determining where to route audio data received by device 110-1, it may select only from 110-2 and 110-3 or may more heavily weight those devices over other potential devices. The same network of an audio receiving device (such as device 110-1) and a potential target device (such as devices 110-2 and 110-3) may be one of a number of different types of networks. If devices are connected to a same access point (AP) (such as a home router) they may be considered as part of the same network. If devices are connected to a private WiFi network (either through one AP or multiple APs) they may be considered as part of the same network. Devices may also be part of the same network if part of a same peer-to-peer, edge, mesh, or other network using WiFi, Bluetooth, Zigbee, Apple HomeKit, Google's Brillo or Weave, or other radio technologies/communication protocols. Thus, in the same-network example, if in the scenario of FIG. 3E, the vehicle 110-5 was still in the driveway and connected to the same network as device 110-4, the server 120 may be more likely to route audio data from input audio 11 to the vehicle 110-5 than if the vehicle were remote to the home.

The system 100 may also determine what target device to send audio data to based on the proximity of devices to each other, when a user is logged in to multiple devices. For example, if a user is simultaneously logged into a laptop and a tablet, and the laptop and tablet are nearby to an audio controlled device, the system 100 may determine that the user is nearby to the audio controlled device, and therefore may weight that device more heavily when determining a target device to send audio data to. For example, in the scenario of FIG. 3D, if user 3 10-3 is logged into a tablet and laptop (not illustrated) and the system determines that the tablet and laptop are in room 3 (or otherwise are nearby to device 110-3), the system may determine that user 3 is also in room 3 (or otherwise is nearby to device 110-3) and may send audio data and a playback instruction to device 110-3. Or, in a different situation, the user 3 may be logged in to device 110-3, and thus the system may route audio data intended for user 3 to device 110-3, by virtue of user 3 being logged in to device 110-3.

In another example, determination of the target device may be made based on the content of the input speech. The input speech may be determined to be above a volume threshold, thus waking a receiving device which then sends audio data to a server 120. The server may then perform speech processing (such as ASR and/or NLU processing as discussed above) on the audio data. Based on the ASR results and/or NLU results, the system may determine a target device for the output audio. For example, if the input audio included the speech "CAN YOU PLEASE BRING ME A DRINK?" the system may determine that the intended recipient of the speech is anyone near the refrigerator. Thus the system may determine that the target device is device 110-2 of FIG. 3B and thus may send the audio data and playback instruction to device 110-2, which would then playback output audio 15. Similarly, if the input audio included the speech "PLEASE CHANGE THE LAUNDRY" the system may determine that the intended recipient of the speech is anyone near the laundry machine and thus may send the audio data to a device proximate to the laundry machine (which may be the laundry machine itself if it is configured like a device 110).

Similarly, the input audio may be analyzed for indications of another user that may be targeted. One or more gazetteers 284 may configured and associated with particular devices or speaking users to allow the system to recognize user names or other identifiers to assist with volume-activated communications. For example, referring again to FIG. 3B, the system may be configured with a gazetteer 284 allowing the system to recognize names of particular individuals associated with user 1. In this example, user 2's name is John and an indication of the user's name and/or association with user 1 may be known to the system. Thus, if the input audio 11 included the speech "JOHN COME HERE!" the server 120 may perform speech processing on the audio data to identify "JOHN" as speech identifying the target of the speech, specifically user 2 10-2. The system may then determine that user 2 is proximate to device 110-2 and thus deliver the audio data and playback command to device 110-2. The target identifying portion of the speech need not be a name. For example, a gazetteer or other configuration may allow the system to recognize that when user 1 says "Honey" he is referring to user 2. Thus, if the input audio 11 included the speech "HONEY COME HERE!" the server 120 may perform speech processing on the audio data to identify "HONEY" as speech identifying the target of the speech, specifically user 2 10-2. The system may then determine that user 2 is proximate to device 110-2 and thus deliver the audio data and playback command to device 110-2. Thus the system may select a target device based on content of the input speech.

Other methods of determining the intended target are also possible. For example, the server 120 or other system component may have access to calendar data for multiple users. If user 1 and user 2 have an overlapping calendar appointment at the time the input audio 11 is received the system may determine that the target of the speech is user 2. U.S. patent application Ser. No. 13/715,741 filed on Dec. 14, 2012 in the name of Blanksteen (published as U.S. Patent Publication 2014/0172953) discloses other techniques for identifying a target of input speech that may be used. Other techniques may also be used.

While a volume of speech may initiate communications as described herein, other factors may also be considered when determining whether to send audio to initiate volume-based communications. For example, if user 2 is determined to be an intended target of shouted speech, but user 2 is not near a device 110, the system may determine not to initiate communications. Alternatively, if user 2 is determined to be near a device 110 (for example device 110-3), but certain settings involving device 110-3 or user 2 indicate that either the user or device are not currently receiving communications (for example, the hour is past the user's do not disturb cutoff, or the device 110-3 is on mute), the system may determine not to initiate communications. Other such conditions may also result in no communications, for example if multiple users are near device 110-3 but speaking user 1 has indicated that his shouted communications should only be relayed to the target recipient, the system may determine not to initiate communications.

Although different components of the system 100 may execute different commands as described herein, illustrated in FIG. 4A-4D are certain examples of how components of the system may operate to establish asynchronous voice-initiated communications. Such asynchronous communications may allow high volume speech/non-environmental sound to be captured at one device and output at another. As shown in FIG. 4A, a first device 110-1 may receive (130) audio and may determine (132) that the volume of the audio is above a threshold. Alternatively the device 110-1 may isolate speech within the audio and determine that the speech is above a threshold (or otherwise constitutes high volume speech). The device 110-1 may also determine that a high-volume sound within the audio corresponds to a non-environmental sound (which may or may not be a human generated sound). The device 110-1 may then send (134) the audio data to the server(s) 120. The audio data may correspond to the high volume sound/detected speech. The server(s) 120 may then determine (136) the intended target user of the audio. The server(s) 120 may then determine (138) the intended target device associated with the intended target user. The server(s) 120 may then send (140) the audio data to the target device 110-2. The server(s) 120 may also send a playback instruction to the target device 110-2. The target device 110-2 may then output (144) the audio. In certain embodiments, the system may configure its operation to reduce the latency between receipt of the audio by the receiving device 110-1 and output of audio at the target device 110-2, particularly as high volume speech/sounds may require urgent attention. Such configuration may involve converting audio to audio data in an accelerated manner, perhaps using a low resolution encoder in a manner that may reduce latency, but may also reduce output audio quality. Other latency reducing measures may also be taken, for example foregoing determining that input high-volume audio includes speech before sending the audio data to the server(s) 120, etc.

In another example, the audio is routed based on the content of the audio (for example, content analyzed during speech processing as described above). As shown in FIG. 4B, a first device 110-1 may receive (130) audio and may determine (132) that the volume of the audio is above a threshold. Alternatively the device 110-1 may isolate speech within the audio and determine that the speech is above a threshold (or otherwise constitutes high volume speech). The device 110-1 may then send (134) the audio data to the server(s) 120. The server(s) 120 may then determine (402) the content of the audio, for example through ASR and/or NLU processing. The server(s) 120 may then determine (404) the intended target device associated with the content, for example identifying a device near a refrigerator when the content mentions obtaining a snack. The server(s) 120 may then send (140) the audio data to the target device 110-2. The server(s) 120 may also send a playback instruction to the target device 110-2. The target device 110-2 may then output (144) the audio.

The determination to initiate cross-device volume-initiated communication may be made jointly between the device 110-1 and the server(s) 120. For example, as shown in FIG. 4C, a first device 110-1 may receive (130) audio. Then the first device in conjunction with the server(s) 120 may determine (406) to initiate cross-device volume-initiated communication. That determination may include a volume analysis of the received audio but may also take into account other considerations, such as time, location of the received audio, etc. Further, while the determination is shown in FIG. 4C as occurring prior to the receipt of audio data by the server, it may occur after the audio data is sent (134) from the first device 110-1 to the server(s) 120, thus allowing the server to analyze the content of the audio and potentially determine (408) the target device prior to determining whether to initiate cross-device volume-initiated communications. Thus the system may consider other factors such as speech contents, target user availability or privacy settings, target user location, etc. when determining whether to initiate cross-device volume-initiated communications. If such communications are initiated, the server(s) 120 may then send (140) the audio data to the target device 110-2. The server(s) 120 may also send a playback instruction to the target device 110-2. The target device 110-2 may then output (144) the audio.

Detected high volume audio may also be sent to multiple target devices. As shown in FIG. 4D, a first device 110-1 may receive (130) audio and may determine (132) that the volume of the audio is above a threshold. Alternatively the device 110-1 may isolate speech within the audio and determine that the speech is above a threshold (or otherwise constitutes high volume speech). The device 110-1 may then send (134) the audio data to the server(s) 120. The server(s) 120 may then determine (136) the intended target users of the audio. The server(s) 120 may then determine (138) the intended target devices associated with the intended target users. The server(s) 120 may then send (140-1) the audio data to the first target device 110-2. The server(s) 120 may also send (140-2) the audio data to the second target device 110-3. The server(s) 120 may also send playback instructions to the target devices 110-2 and 110-3. The target devices 110-2 and 110-3 may then output (144-1 and 144-2) the audio.

The system may also establish an ongoing, synchronous (i.e., involving audio exchange), communication connection between multiple devices based on initially receiving high volume speech. As shown in FIG. 4E, a first device 110-1 may receive (130) audio and may determine (132) that the volume of the audio is above a threshold. Alternatively the device 110-1 may isolate speech within the audio and determine that the speech is above a threshold (or otherwise constitutes high volume speech). The device 110-1 may then send (134) the audio data to the server(s) 120. The server(s) 120 may then determine (136) the intended target user of the audio. The server(s) 120 may then determine (138) the intended target device associated with the intended target user. The system may then establish (410) a communication connection between the devices. The server(s) 120 may then send audio data from the first device 110-1 to the second, target device 110-2. Alternately, the first device 110-1 and second device 110-2 may then exchange (412) audio data. That exchange may or may not be routed through server(s) 120. If the server 120 is involved, it may send communication data (such as audio data, routing data, instructions, etc.) between the two devices. At some point the system may then terminate (414) the communication connection between the devices. Further, more than two devices may be connected in this manner.

Figure 5:
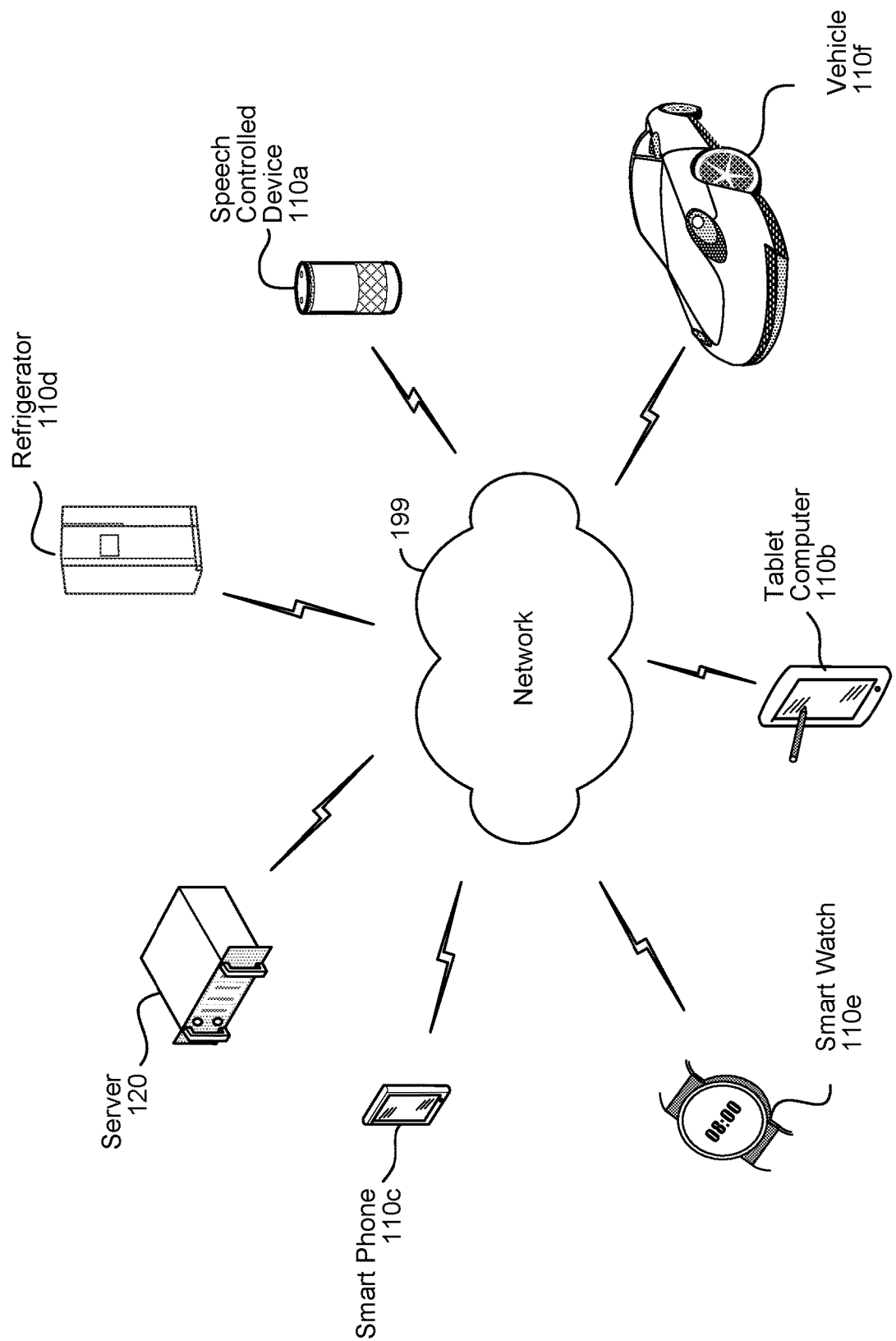
FIG. 5 illustrates an example of a computer network for use with the system.

As illustrated in FIG. 5 multiple devices (120, 110a to 110f) may contain components of the system 100 and the devices may be connected over a network 199. Network 199 may include a local or private network or may include a wide network such as the internet. Devices may be connected to the network 199 through either wired or wireless connections. For example, a speech controlled device 110a, a tablet computer 110b, a smart phone 110c, a refrigerator 110d, a smart watch 110e, and/or a vehicle 110f may be connected to the network 199 through a wireless service provider, over a WiFi or cellular network connection or the like. Other devices are included as network-connected support devices, such as a server 120. The support devices may connect to the network 199 through a wired connection or wireless connection. Networked devices 110 may capture audio using one-or-more built-in or connected microphones 650 or audio capture devices, with processing performed by ASR, NLU, or other components of the same device or another device connected via network 199, such as an ASR 250, NLU 260, etc. of one or more servers 120. If a speaking user is near a first device, for example speech controlled device 110a, and a target user is near a second device, for example, smart watch 110e, the system may, upon detecting high volume speech at device 110a, connect device 110a and 110e for sending audio as described above. In another example, if multiple target users are identified, for example the second user near smart watch 110e and a third user near vehicle 110f, the system may, upon detecting high volume speech at device 110a, connect device 110a to both devices 110e and 110f for sending audio as described above.

Figure 6:
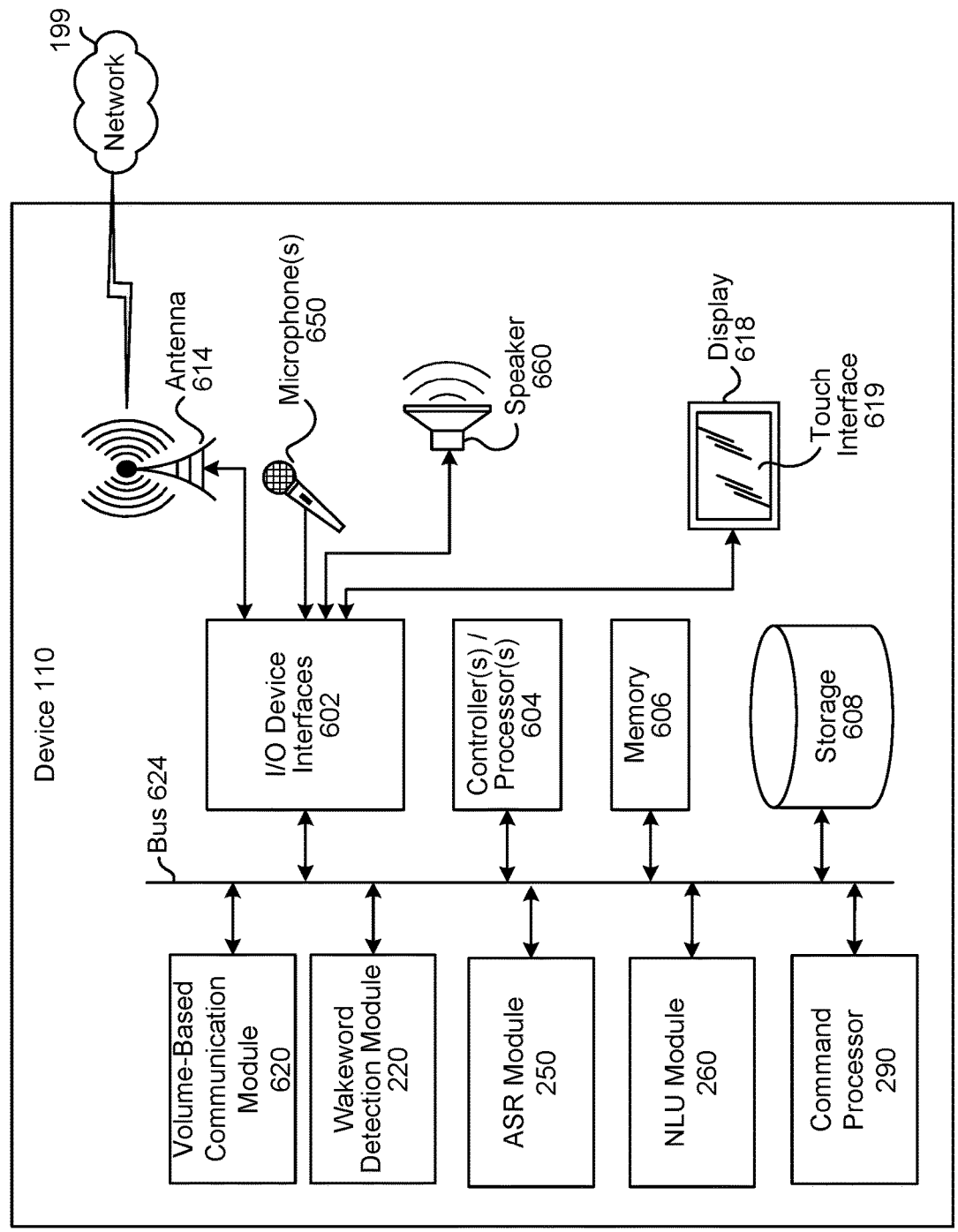
FIG. 6 is a block diagram conceptually illustrating example components of a device according to embodiments of the present disclosure.

FIG. 6 is a block diagram conceptually illustrating a local device 110 that may be used with the described system and may incorporate certain speech receiving/keyword spotting capabilities. FIG. 7 is a block diagram conceptually illustrating example components of a remote device, such as a remote server 120 that may assist with ASR, NLU processing, or command processing. Server 120 may also assist in determining similarity between ASR hypothesis results as described above. Multiple such servers 120 may be included in the system, such as one server 120 for ASR, one server 120 for NLU, etc. In operation, each of these devices may include computer-readable and computer-executable instructions that reside on the respective device (110/120), as will be discussed further below.

Each of these devices (110/120) may include one or more controllers/processors (604/704), that may each include a central processing unit (CPU) for processing data and computer-readable instructions, and a memory (606/706) for storing data and instructions of the respective device. The memories (606/706) may individually include volatile random access memory (RAM), non-volatile read only memory (ROM), non-volatile magnetoresistive (MRAM) and/or other types of memory. Each device may also include a data storage component (608/708), for storing data and controller/processor-executable instructions. Each data storage component may individually include one or more non-volatile storage types such as magnetic storage, optical storage, solid-state storage, etc. Each device may also be connected to removable or external non-volatile memory and/or storage (such as a removable memory card, memory key drive, networked storage, etc.) through respective input/output device interfaces (602/702).

Computer instructions for operating each device (110/120) and its various components may be executed by the respective device's controller(s)/processor(s) (604/704), using the memory (606/706) as temporary "working" storage at runtime. A device's computer instructions may be stored in a non-transitory manner in non-volatile memory (606/706), storage (608/708), or an external device(s). Alternatively, some or all of the executable instructions may be embedded in hardware or firmware on the respective device in addition to or instead of software.

Each device (110/120) includes input/output device interfaces (602/702). A variety of components may be connected through the input/output device interfaces, as will be discussed further below. Additionally, each device (110/120) may include an address/data bus (624/724) for conveying data among components of the respective device. Each component within a device (110/120) may also be directly connected to other components in addition to (or instead of) being connected to other components across the bus (624/724).

Referring to the device 110 of FIG. 6, the device 110 may include a display 618, which may comprise a touch interface 619. Or the device 110 may be "headless" and may primarily rely on spoken commands for input. As a way of indicating to a user that a connection between another device has been opened, the device 110 may be configured with a visual indicator, such as an LED or similar component (not illustrated), that may change color or otherwise indicate that a connection has been opened with another device. The device 110 may also include input/output device interfaces 602 that connect to a variety of components such as an audio output component such as a speaker 660, a wired headset or a wireless headset (not illustrated) or other component capable of outputting audio. The device 110 may also include an audio capture component. The audio capture component may be, for example, a microphone 650 or array of microphones, a wired headset or a wireless headset (not illustrated), etc. If an array of microphones is included, approximate distance to a sound's point of origin may be performed acoustic localization based on time and amplitude differences between sounds captured by different microphones of the array. The microphone 650 may be configured to capture audio. The device 110 (using microphone 650, wakeword detection module 220, ASR module 250, etc.) may be configured to determine audio data corresponding to detected audio data. The device 110 (using input/output device interfaces 602, antenna 614, etc.) may also be configured to transmit the audio data to server 120 for further processing or to process the data using internal components such as a wakeword detection module 220.

For example, via the antenna(s), the input/output device interfaces 602 may connect to one or more networks 199 via a wireless local area network (WLAN) (such as WiFi) radio, Bluetooth, and/or wireless network radio, such as a radio capable of communication with a wireless communication network such as a Long Term Evolution (LTE) network, WiMAX network, 3G network, etc. A wired connection such as Ethernet may also be supported. Through the network(s) 199, the speech processing system may be distributed across a networked environment.

The device 110 and/or server 120 may include an ASR module 250. The ASR module in device 110 may be of limited or extended capabilities. The ASR module 250 may include the language models 254 stored in ASR model storage component 252, and an ASR module 250 that performs the automatic speech recognition process. If limited speech recognition is included, the ASR module 250 may be configured to identify a limited number of words, such as keywords detected by the device, whereas extended speech recognition may be configured to recognize a much larger range of words.

The device 110 and/or server 120 may include a limited or extended NLU module 260. The NLU module in device 110 may be of limited or extended capabilities. The NLU module 260 may comprising the name entity recognition module 262, the intent classification module 264 and/or other components. The NLU module 260 may also include a stored knowledge base 272 and/or entity library 282, or those storages may be separately located.

The device 110 and/or server 120 may also include a command processor 290 that is configured to execute commands/functions associated with a spoken command as described above.

The device 110 may include a wakeword detection module 220, which may be a separate component or may be included in an ASR module 250. The wakeword detection module 220 receives audio signals and detects occurrences of a particular expression (such as a configured keyword) in the audio. This may include detecting a change in frequencies over a specific period of time where the change in frequencies results in a specific audio signature that the system recognizes as corresponding to the keyword. Keyword detection may include analyzing individual directional audio signals, such as those processed post-beamforming if applicable. Other techniques known in the art of keyword detection (also known as keyword spotting) may also be used. In some embodiments, the device 110 may be configured collectively to identify a set of the directional audio signals in which the wake expression is detected or in which the wake expression is likely to have occurred.

The wakeword detection module 220 receives captured audio and processes the audio (for example, using model(s) 232) to determine whether the audio corresponds to particular keywords recognizable by the device 110 and/or system 100. The storage 608 may store data (for example, keyword model storage 230 including speech models 232 relating to keywords, keyword function storage 240 including keyword data 242 and/or other data) relating to keywords and functions to enable the wakeword detection module 220 to perform the algorithms and methods described above. The locally stored speech models may be pre-configured based on known information, prior to the device 110 being configured to access the network by the user. For example, the models may be language and/or accent specific to a region where the user device is shipped or predicted to be located, or to the user himself/herself, based on a user profile, etc. In an aspect, the models may be pre-trained using speech or audio data of the user from another device. For example, the user may own another user device that the user operates via spoken commands, and this speech data may be associated with a user profile. The speech data from the other user device may then be leveraged and used to train the locally stored speech models of the device 110 prior to the user device 110 being delivered to the user or configured to access the network by the user. The wakeword detection module 220 may access the storage 608 and compare the captured audio to the stored models and audio sequences using audio comparison, pattern recognition, keyword spotting, audio signature, and/or other audio processing techniques.

The device 110 and/or server 120 may include a volume-based communication module 620. The volume-based communication module 620 may incorporate software, hardware, firmware, etc. to analyze audio data (such as that received by a microphone 650) and set volume thresholds, analyze incoming audio data against those thresholds, and initiate volume-based communications as described generally above.

A device 110, may be associated with a user profile. For example, as illustrated in FIGS. 3A-3F or 4A-4E, devices 110-1 through 110-5, may each be associated with a user profile (where the user profile may be the same or different across the devices). For example, a device may be associated with a user identification (ID) number or other profile information linking the device to a user account. The user account/ID/profile may be used by the system to perform speech controlled commands (for example commands discussed above in reference to FIG. 2). The user account/ID/profile may be associated with particular model(s) or other information used to identify received audio, classify received audio (for example as a non-environmental sound, human generated sounds, and/or speech), volume thresholds used to determine if detected audio exceeds a threshold, or other information used to initiate volume-initiated communications of the system. The user account/ID/profile may also be used to route volume-initiated communications of the system. In one example multiple devices on either end of a communication (for example devices 110-1 and 110-3 illustrated in FIG. 4A-4E) are associated with a same user profile. As part of determining a target device (138/404/408) or other steps, the server(s) 120 may determine that the same user profile is associated with the receiving device 110-1 and target device(s) 110-2 and/or 110-3. This may assist the system in quickly outputting the high volume audio to the intended user. In another example a receiving device 110-1 and target device 110-2 may be associated with different user profiles, but still be operable within the system 100. The different user profiles may be linked (for example in the case of family members) or may be unaffiliated. The user profile may or may not be associated with the intended recipient. For example, in the example of FIGS. 3A-3F, devices 110-1, 110-2 and 110-4 may be associated with user 1 (who may be a parent in the home), device 110-3 may be associated with user 3 (who may be a child in the home) and device 110-5 may be associated with user 2 (who may be another parent in the home). Such user profiles may or may not be used by the system 100 to route audio data as described herein (for example, the system may more heavily weight a device with a same or linked user profile from the device receiving the audio when determining which device should be the receiving device).

As noted above, multiple devices may be employed in a single speech processing system. In such a multi-device system, each of the devices may include different components for performing different aspects of the speech processing. The multiple devices may include overlapping components. The components of the devices 110 and server 120, as illustrated in FIGS. 6 and 7, are exemplary, and may be located as a stand-alone device or may be included, in whole or in part, as a component of a larger device or system.

The concepts disclosed herein may be applied within a number of different devices and computer systems, including, for example, general-purpose computing systems, speech processing systems, and distributed computing environments.

The above aspects of the present disclosure are meant to be illustrative. They were chosen to explain the principles and application of the disclosure and are not intended to be exhaustive or to limit the disclosure. Many modifications and variations of the disclosed aspects may be apparent to those of skill in the art. Persons having ordinary skill in the field of computers and speech processing should recognize that components and process steps described herein may be interchangeable with other components or steps, or combinations of components or steps, and still achieve the benefits and advantages of the present disclosure. Moreover, it should be apparent to one skilled in the art, that the disclosure may be practiced without some or all of the specific details and steps disclosed herein.

Aspects of the disclosed system may be implemented as a computer method or as an article of manufacture such as a memory device or non-transitory computer readable storage medium. The computer readable storage medium may be readable by a computer and may comprise instructions for causing a computer or other device to perform processes described in the present disclosure. The computer readable storage media may be implemented by a volatile computer memory, non-volatile computer memory, hard drive, solid-state memory, flash drive, removable disk and/or other media. In addition, components of one or more of the modules and engines may be implemented as in firmware or hardware, such as the acoustic front end 256, which comprise among other things, analog and/or digital filters (e.g., filters configured as firmware to a digital signal processor (DSP)).

As used in this disclosure, the term "a" or "one" may include one or more items unless specifically stated otherwise. Further, the phrase "based on" is intended to mean "based at least in part on" unless specifically stated otherwise.

What is claimed is:
1. A system, comprising:
at least one processor; and
at least one memory comprising instructions that, when executed by the at least one processor, cause the system to:
receive, by a first device, audio data representing speech satisfying a volume threshold;
determine, based at least in part on the speech satisfying the volume threshold, that a two-way communication session is to be established;
determine a first intended recipient user of the two-way communication session;
determine the first intended recipient user is within a physical proximity to a second device;
establish the two-way communication session using the first device and the second device, the two-way communication session being established without receiving an acceptance of the two-way communication session from the first intended recipient user;
determine, after establishing the two-way communication session, that the first intended recipient user is within a physical proximity to a third device;
add, based at least in part on determining the first intended recipient user is within a physical proximity to the third device, the third device to the two-way communication session;

determine, after establishing the two-way communication session, that the first intended recipient user is no longer within a physical proximity to the second device; and end, based at least in part on determining that the first intended recipient user is no longer within a physical proximity to the second device, the second device from the two-way communication session.

2. The system of claim 1, wherein the at least one memory further comprises instructions that, when executed by the at least one processor, further cause the system to:

determine, prior to receiving the audio data, that a first user, corresponding to the first device, and the first intended recipient user are within a location for at least a threshold amount of time;

store, prior to receiving the audio data and based at least in part on determining the first user and the first intended recipient user are within the location for at least the threshold amount of time, first data associating the first user and the first intended recipient user; and determine the first intended recipient user based at least in part on the first data.

3. The system of claim 2, wherein the at least one memory further comprises instructions that, when executed by the at least one processor, further cause the system to:

determine a first wearable device of the first user was within the location with a second wearable device of the first intended recipient user for at least the threshold amount of time; and store the first data further based at least in part on determining the first wearable device was within the location with the second wearable device for at least the threshold amount of time.

4. The system of claim 3, wherein the at least one memory further comprises instructions that, when executed by the at least one processor, further cause the system to:

determine the second wearable device is no longer in the location, wherein the audio data is received after the second wearable device is no longer in the location.

5. The system of claim 1, wherein the at least one memory further comprises instructions that, when executed by the at least one processor, further cause the system to:

determine a second intended recipient user of the two-way communication session;

determine the second intended recipient user is within a physical proximity to a fourth device; and establish the two-way communication session further using the fourth device.

6. The system of claim 1, wherein:

the first device is a headless device;

the second device is a headless device; and the first device and the second device are associated with a same speech processing system.

7. The system of claim 1, wherein the at least one memory further comprises instructions that, when executed by the at least one processor, further cause the system to:

determine, after establishing the two-way communication session, that the first intended recipient user is in a same location as a first user corresponding to the first device; and end the two-way communication session based at least in part on determining the first intended recipient user is in the same location as the first user.

8. The system of claim 1, wherein the at least one memory further comprises instructions that, when executed by the at least one processor, further cause the system to:

determine a second intended recipient user;

determine the second intended recipient user is within a physical proximity to the second device and a fourth device; and establish the two-way communication session without using the fourth device based at least in part on:

the two-way communication session being established using the first device and the second device, and the second intended recipient user being within the physical proximity to the second device.

9. A method, comprising:

receiving, by a first device, audio data representing speech satisfying a volume threshold;

determining, based at least in part on the speech satisfying the volume threshold, that a two-way communication session is to be established;

determining a first intended recipient user of the two-way communication session;

determining the first intended recipient user is proximate to a second device;

establishing the two-way communication session using the first device and the second device, the two-way communication session being established without receiving an acceptance of the two-way communication session from the first intended recipient user;

determining, after establishing the two-way communication session, that both the first intended recipient user and a first user corresponding to the first device are within a first location; and ending the two-way communication session based at least in part on determining both the first intended recipient user and the first user are in the first location, wherein ending the two-way communication session comprises ceasing an exchange of data between the first device and the second device.

10. The method of claim 9, further comprising:

determining, prior to receiving the audio data, that both the first user and the first intended recipient user are within a second location for at least a threshold amount of time;

storing, prior to receiving the audio data and based at least in part on determining the first user and the first intended recipient user are within the second location for at least the threshold amount of time, first data associating the first user and the first intended recipient user; and determining the first intended recipient user based at least in part on the first data.

11. The method of claim 10, further comprising:

determining a first wearable device of the first user was within the second location with a second wearable device of the first intended recipient user for at least the threshold amount of time; and storing the first data further based at least in part on determining the first wearable device was within the second location with the second wearable device for at least the threshold amount of time.

12. The method of claim 11, further comprising:

determining the second wearable device is no longer in the second location, wherein the audio data is received after the second wearable device is no longer in the second location.

13. The method of claim 9, further comprising:

determining, after establishing the two-way communication session, that the first intended recipient user is detected by a third device; and adding the third device to the two-way communication session.

14. The method of claim 13, further comprising:
ending, after determining the first intended recipient user is detected by the third device, the two-way communication session with respect to the second device.

15. The method of claim 9, further comprising:
determining a second intended recipient user of the two-way communication session;
determining the second intended recipient user is proximate to a third device; and
establishing the two-way communication session further using the third device.

16. The method of claim 9, wherein:
the first device is a headless device;
the second device is a headless device; and
the first device and the second device are associated with a same speech processing system.

17. The method of claim 9, further comprising:
determining a second intended recipient user;
determining the second intended recipient user is proximate to the second device and a third device; and
establishing the two-way communication session without using the third device based at least in part on:
the two-way communication session being established using the first device and the second device, and
the second intended recipient user being proximate to the second device.

* * * * *